(12) United States Patent
Kurose et al.

(10) Patent No.: US 9,634,627 B2
(45) Date of Patent: Apr. 25, 2017

(54) AMPLIFICATION CIRCUIT AND ANALOG/DIGITAL CONVERSION CIRCUIT

(71) Applicant: Kabushiki Kaisha Toshiba, Minato-ku, Tokyo (JP)

(72) Inventors: Daisuke Kurose, Yokohama Kanagawa (JP); Tomohiko Sugimoto, Yokohama Kanagawa (JP); Hirotomo Ishii, Kamakura Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/065,098

(22) Filed: Mar. 9, 2016

(65) Prior Publication Data

US 2016/0359463 A1    Dec. 8, 2016

(30) Foreign Application Priority Data

Jun. 3, 2015   (JP) ................. 2015-113365

(51) Int. Cl.
  *H03M 1/00*    (2006.01)
  *H03F 3/45*    (2006.01)
  *H03M 1/50*    (2006.01)
  *H03M 1/12*    (2006.01)

(52) U.S. Cl.
  CPC ............ *H03F 3/45* (2013.01); *H03M 1/1245* (2013.01); *H03M 1/50* (2013.01); *H03F 2200/129* (2013.01); *H03F 2203/45116* (2013.01)

(58) Field of Classification Search
  CPC ...... H03M 1/1245; H03M 1/50; H03M 1/002; H03M 1/12; H03M 1/506; H03M 1/145; H03F 3/45; H03F 2203/45116; H03F 2200/129

USPC ................... 341/122, 156, 155, 118
See application file for complete search history.

(56) References Cited

U.S. PATENT DOCUMENTS

| | | | | |
|---|---|---|---|---|
| 7,532,069 | B2* | 5/2009 | Ito ................. | H03F 3/45179 330/253 |
| 7,847,601 | B2* | 12/2010 | Chou ................. | H03K 5/2481 327/534 |
| 8,223,058 | B2* | 7/2012 | Kobayashi .......... | H03M 1/0607 341/118 |
| 2009/0201051 | A1 | 8/2009 | Ono et al. | |
| 2010/0142653 | A1 | 6/2010 | Furuta et al. | |

FOREIGN PATENT DOCUMENTS

JP    2013-153246 A    8/2013
WO    2015/174166 A1   11/2015

* cited by examiner

*Primary Examiner* — Jean B Jeanglaude
(74) *Attorney, Agent, or Firm* — White & Case LLP

(57) ABSTRACT

According to one embodiment, an amplification circuit includes a differential amplifier and a feedback circuit. The differential amplifier includes a sampling circuit that samples a first voltage which is a difference between an adjustment voltage supplied to a first terminal and a first input voltage, and a second voltage which is a difference between the adjustment voltage and a second input voltage. The differential amplifier amplifies the first voltage to output a first voltage signal and amplifies the second voltage to output a second voltage signal. The feedback circuit detects a common mode voltage of the first voltage signal and the second voltage signal, and adjusts the adjustment voltage which is supplied to the first terminal in accordance with the common mode voltage.

13 Claims, 15 Drawing Sheets

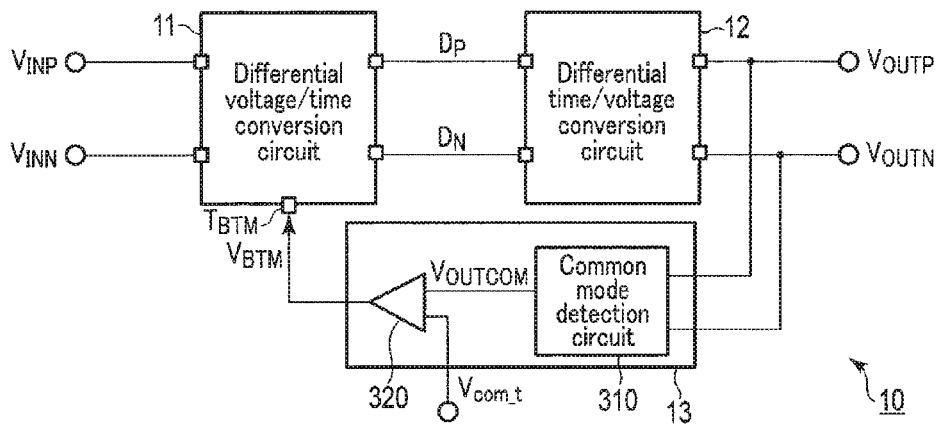
F I G. 1
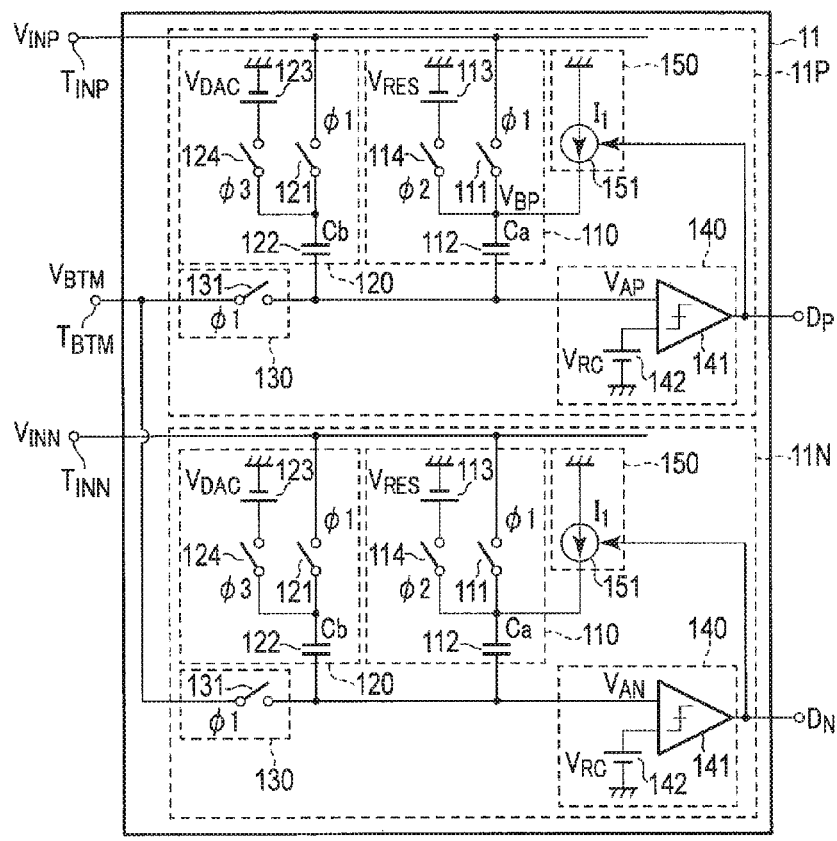
F I G. 2

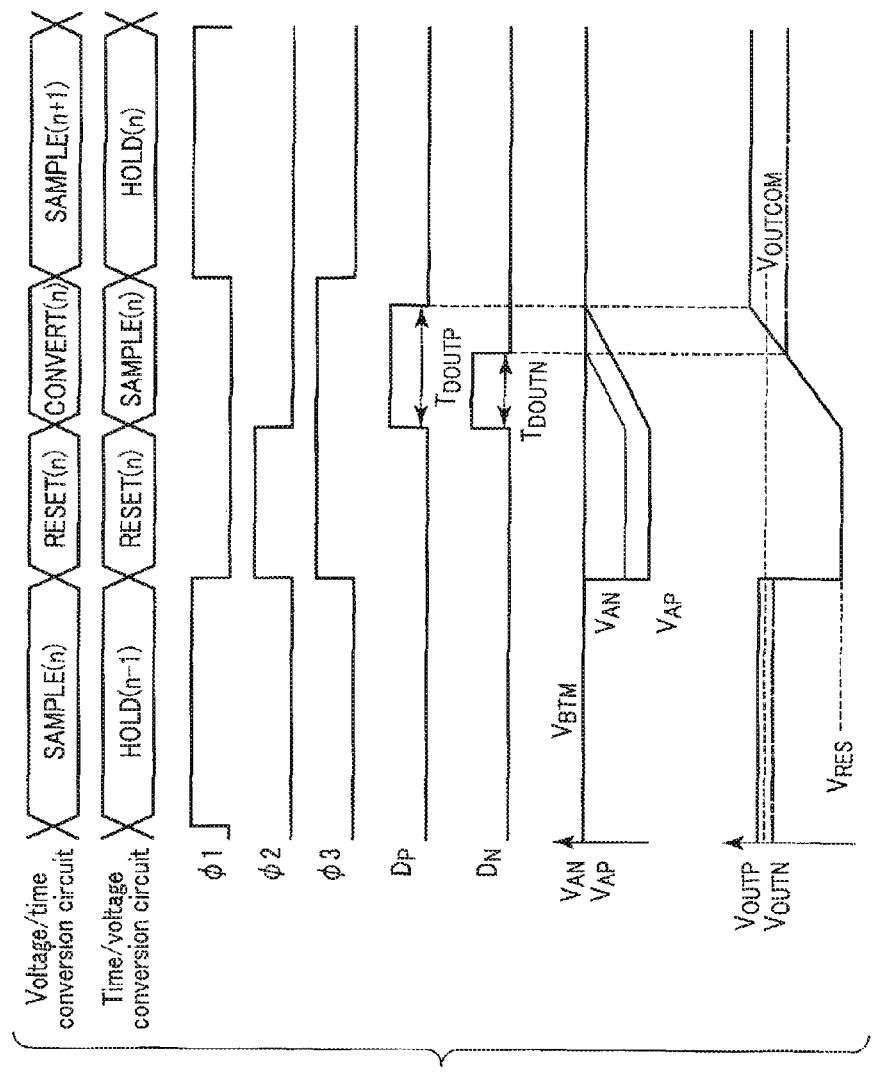
F I G. 8

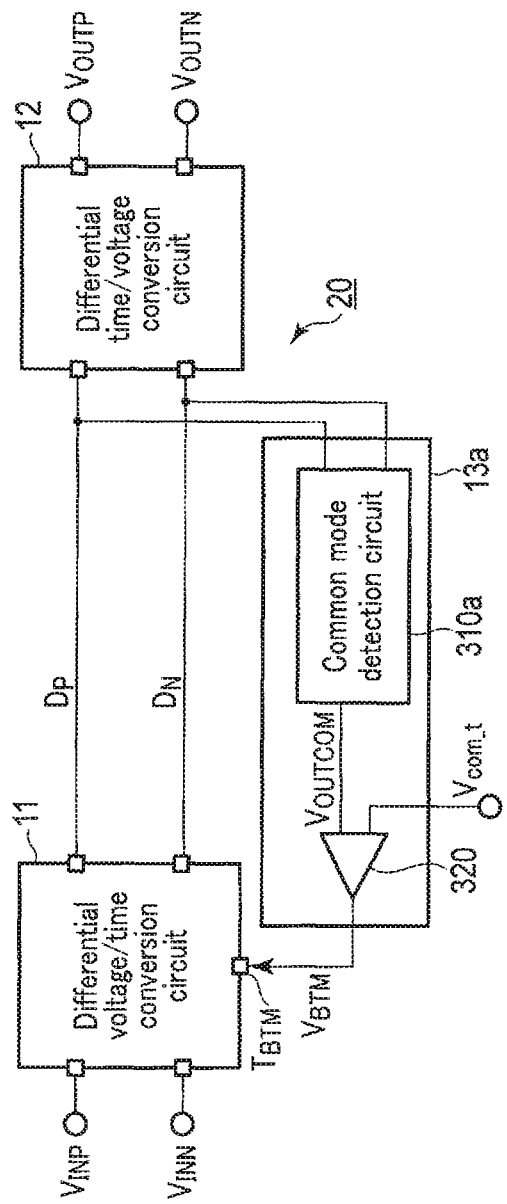
F I G. 13

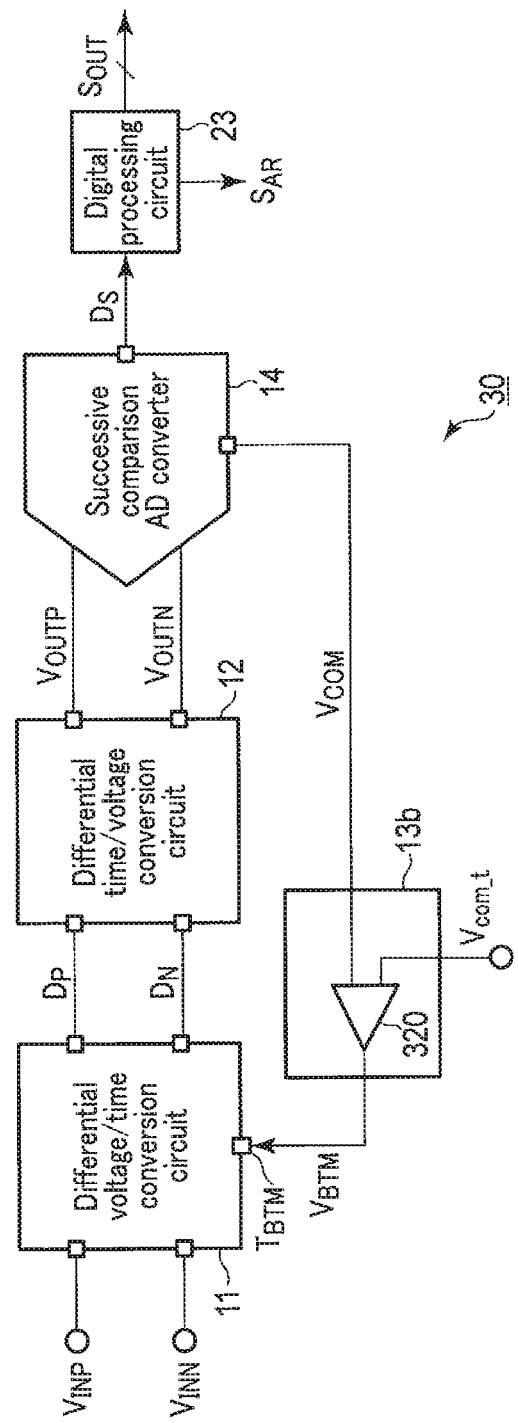
F I G. 15

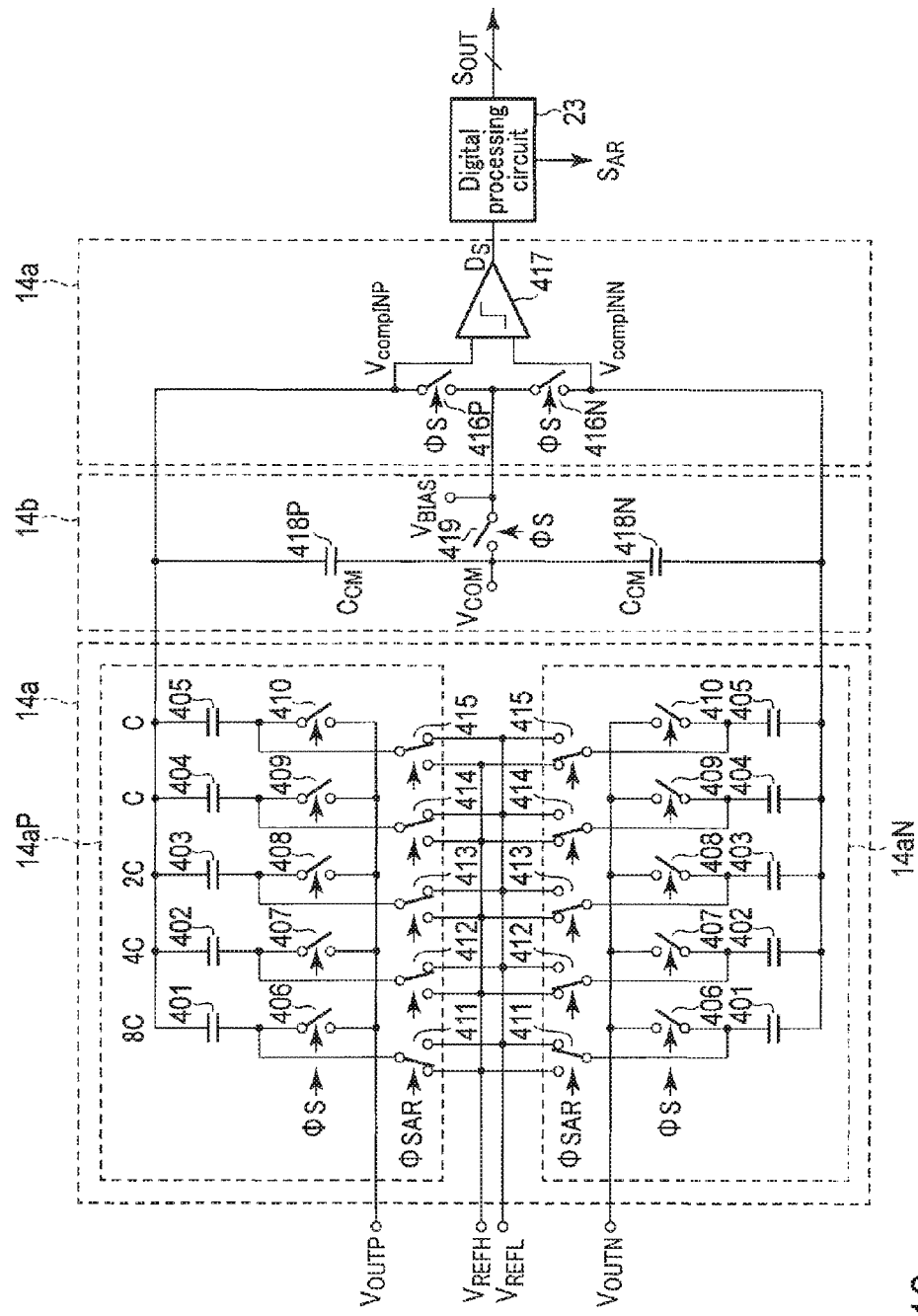
F I G. 16

AMPLIFICATION CIRCUIT AND ANALOG/DIGITAL CONVERSION CIRCUIT

CROSS-REFERENCE TO RELATED APPLICATIONS

This application is based upon and claims the benefit of priority from the Japanese Patent Application No. 2015-113365, filed Jun. 3, 2015, the entire contents of which are incorporated herein by reference.

FIELD

Embodiments described herein relate generally to an amplification circuit and an analog/digital conversion circuit including the amplification circuit.

BACKGROUND

An analog/digital conversion circuit (which will be also referred to as an AD conversion circuit hereinafter) that performs conversion from an analog signal into a digital signal (which will be referred to as analog/digital conversion hereinafter) generally has an amplification circuit that executes amplification calculations.

The amplification circuit often uses differential signals to improve signal quality, and in this case, the amplification circuit becomes a differential configuration. When the amplification circuit has the differential configuration, it has a common mode gain, and hence, a common mode voltage which is output from the amplification circuit fluctuates due to fluctuations or the like of the input common mode voltage. A large fluctuation of the common mode voltage exceeds a voltage range where an internal current source appropriately operates in some cases, which may be a cause for errors of amplification calculations.

BRIEF DESCRIPTION OF THE DRAWING

FIG. 1 is a block diagram showing a configuration of an amplification circuit according to a first embodiment;

FIG. 2 is a circuit diagram showing a configuration of a differential voltage/time conversion circuit in the first embodiment;

FIG. 8 is a timing chart showing an operation of the amplification circuit according to the first embodiment;

FIG. 13 is a block diagram showing a configuration of an amplification circuit according to a second embodiment;

FIG. 15 is a block diagram showing a configuration of an AD conversion circuit according to a third embodiment;

FIG. 16 is a circuit diagram showing a configuration of a successive comparison type AD converter in the third embodiment;

DETAILED DESCRIPTION

Figure 3:
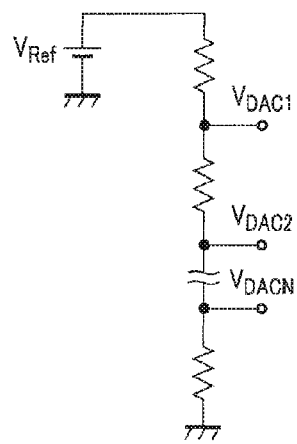
FIG. 3 is a circuit diagram showing a configuration of a ladder resistor in the differential voltage/time conversion circuit in the first embodiment.

Hereinafter, embodiments will be described with reference to the drawings. It is to be noted that in the following description, for constitutional elements each having the same function and constitution, common reference symbols will be attached.

In general, according to one embodiment, an amplification circuit includes a differential, amplifier and a feedback circuit. The differential amplifier includes a sampling circuit that samples a first voltage which is a difference between an adjustment voltage supplied to a first terminal and a first input voltage, and a second voltage which is a difference between the adjustment voltage and a second input voltage. The differential amplifier amplifies the first voltage to output a first voltage signal and amplifies the second voltage to output a second voltage signal. The feedback circuit detects a common mode voltage of the first voltage signal and the second voltage signal, and adjusts the adjustment voltage which is supplied to the first terminal in accordance with the common mode voltage.

First Embodiment

An amplification circuit according to a first embodiment will be described.

1. Configuration of Amplification Circuit

FIG. 1 is a block diagram showing a configuration of an amplification circuit according to the first embodiment. As shown in the drawing, an amplification circuit 10 includes a differential voltage/time conversion circuit 11, a differential time/voltage conversion circuit 12, and a common mode feedback circuit 13.

The differential voltage/time conversion circuit 11 is a circuit that performs conversion from a voltage signal into a time signal (which will be referred to as voltage/time conversion hereinafter), and it converts two input voltages (analog signals) $V_{INP}$ and $V_{INN}$ into time signals $D_P$ and $D_N$, respectively. The input voltages $V_{INP}$ and $V_{INN}$ constitute differential signals, namely, signals with phases opposite to each other.

The differential time/voltage conversion circuit 12 is a circuit that performs conversion from a time signal into a voltage signal (which will be referred to as time/voltage conversion hereinafter), and it converts the time signals $D_P$ and $D_N$ output from the differential voltage/time conversion circuit 11 into voltages $V_{OUTP}$ and $V_{OUTN}$, respectively.

The common mode feedback circuit 13 detects a common mode voltage $V_{OUTCOM}$ from the voltages $V_{OUTP}$ and $V_{OUTN}$. Further, the detected common mode voltage $V_{OUTCOM}$ is compared with a set voltage of a target common mode voltage (which will be referred to as a target voltage hereinafter) $V_{com\_t}$, and an adjustment voltage (which will be also referred to as a bottom plate voltage hereinafter) $V_{BTM}$ according to a comparison result is output.

The differential voltage/time conversion circuit. 11 has a bottom plate terminal $T_{BTM}$. The differential voltage/time conversion circuit 11 and the differential time/voltage conversion circuit 12 stabilize the common mode voltage $V_{OUTCOM}$ to a desired voltage by using the bottom plate voltage $V_{BTM}$ input to the bottom plate terminal $T_{BTM}$. The differential voltage/time conversion circuit 11 converts the input voltages $V_{INP}$ and $V_{INN}$ into the time signals $D_P$ and $D_N$ in accordance with the bottom plate voltage $V_{BTM}$ supplied to the bottom plate terminal $T_{BTM}$, respectively. Furthermore, as described above, the differential time/voltage conversion circuit 12 converts the time signals $D_P$ and $D_N$ into the voltages $V_{OUTP}$ and $V_{OUTN}$, respectively.

The differential voltage/time conversion circuit 11 includes a sampling circuit that samples a first difference voltage of the bottom plate voltage $V_{BTM}$ supplied to the bottom plate terminal (a first terminal) $T_{BTM}$ and the input voltage $V_{INP}$, and a second difference voltage of the bottom plate voltage $V_{BTM}$ and the input voltage $V_{INN}$. The amplification circuit 10 amplifies the first and second difference voltages, and outputs the voltages $V_{OUTP}$ and $V_{OUTN}$, respectively.

1.1 Differential Voltage/Time Conversion Circuit

FIG. 2 is a circuit diagram showing a configuration of the differential voltage time conversion circuit 11. As shown in the drawing, the differential voltage/time conversion circuit 11 includes a positive converter 11P and a negative converter 11N. The positive converter 11P performs voltage/time conversion to the input voltage $V_{INP}$, and outputs the time signal $D_P$. The negative converter 11N performs voltage/time conversion to the input voltage $V_{INN}$, and outputs the time signal $D_N$. The positive converter 11P and the negative converter 11N output the time signals $P_P$ and $D_N$ to the differential time/voltage conversion circuit 12, respectively. The positive converter 11P and the negative converter 11N has the common bottom plate terminal $T_{BTM}$. The bottom plate voltage $V_{BTM}$ is supplied to the bottom plate terminal $T_{BTM}$.

The positive converter 11P generates the time signal $D_P$ by performing the voltage/time conversion to the input voltage $V_{INP}$. The time signal $D_P$ represents a time length that is dependent on a potential of the input voltage $V_{INP}$. The time signal $D_P$ is, e.g., a rectangular wave signal having a pulse width that varies in proportion to the input voltage $V_{INP}$.

The positive converter 11P includes a first sampling circuit 110, a second sampling circuit 120, a bottom plate sampler 130, a detector 140, and a signal generator 150. Here, to simplify a description, an example where the single second sampling circuit 120 is included as the second sampling circuit will be described, but a plurality of second sampling circuits may be arranged.

The first sampling circuit 110 includes a switch 111, a sampling capacitor (a capacitor) 112, a voltage source 113, and a switch 114. The sampling capacitor 112 has a first terminal and a second terminal. The voltage source 113 has a positive electrode terminal and a negative electrode terminal.

The second sampling circuit 120 includes a switch 121, a sampling capacitor 122, a voltage source 123, and a switch 124. The sampling capacitor 122 has a first terminal and a second terminal. The voltage source 123 has a positive electrode terminal and a negative electrode terminal.

The bottom plate sampler 130 includes a switch 131. The detector 140 includes a comparator 141 and a voltage source 142. The comparator 141 includes a first input terminal, a second input terminal, and an output terminal. The voltage source 142 has a positive electrode terminal and a negative electrode terminal. Further, the signal generator 150 includes a current source 151. The current source 151 includes a first terminal, a second terminal, and a control terminal.

The switch 111 of the first sampling circuit 110 is arranged between an input terminal $T_{INP}$ to which the input voltage $V_{INP}$ is input and the first terminal of the sampling capacitor 112. The switch 111 shorts or opens the input terminal $T_{INP}$ and the first terminal of the sampling capacitor 112 in accordance with a first switch control signal ($\phi1$).

Specifically, in a sample phase of the differential voltage/time conversion circuit 11, the switch 111 shorts the input terminal $T_{INP}$ and the first terminal of the sampling capacitor 112. On the other hand, in a reset phase and a conversion phase of the differential voltage/time conversion circuit 11, the switch 111 opens the input terminal $T_{INP}$ and the first terminal of the sampling capacitor 112.

The first terminal of the sampling capacitor 112 is connected to the switch 111, the switch 114, and the current source 151 of the signal generator 150. The second terminal of the sampling capacitor 112 is connected to the switch 131 of the bottom plate sampler 130 and the first input terminal of the comparator 141 of the detector 140. A capacitance of the sampling capacitor 112 is assumed to be Ca.

The positive electrode terminal of the voltage source 113 is connected the switch 114. The negative electrode terminal of the voltage source 113 is grounded. The voltage source 113 generates a reset voltage $V_{RES}$.

The switch 114 is arranged between the first terminal of the sampling capacitor 112 and the positive electrode terminal of the voltage source 113. The switch 114 shorts or opens the first terminal of the sampling capacitor 112 and the positive electrode terminal of the voltage source 113 in accordance with a second switch control signal ($\phi2$).

Specifically, in the reset phase of the differential voltage/time conversion circuit 11, the switch 114 shorts the first terminal of the sampling capacitor 112 and the positive electrode terminal of the voltage source 113. On the other hand, in the sample phase and the conversion phase of the differential voltage/time conversion circuit 11, the switch 114 opens the first terminal of the sampling capacitor 112 and the positive electrode terminal of the voltage source 113.

The switch 121 of the second sampling circuit 120 is arranged between the input terminal $T_{INP}$ and the first terminal of the sampling capacitor 122. The switch 121 shorts or opens the input terminal $T_{INP}$ and the first terminal of the sampling capacitor 122 in accordance with the first switch control signal ($\phi1$).

Specifically, in the sample phase of the differential voltage/time conversion circuit 11, the switch 121 shorts the input terminal $T_{INP}$ and the first terminal of the sampling capacitor 122. On the other hand, in the reset phase and the conversion phase of the differential voltage/time conversion circuit 11, the switch 121 opens the input terminal $T_{INP}$ and the first terminal of the sampling capacitor 122.

The first terminal of the sampling capacitor 122 is connected to the switch 121 and the switch 124. The second terminal of the sampling capacitor 122 is connected to the switch 131 of the bottom plate sampler 130 and the first input terminal of the comparator 141 of the detector 140. The capacitance of the sampling capacitor 122 is assumed to be Cb.

The positive electrode terminal of the voltage source 123 is connected to the switch 124. The negative electrode terminal of the voltage source 123 is grounded. The voltage source 123 generates an adjustment voltage $V_{DAC}$. This voltage $V_{DAC}$ may be controlled by a control signal which is not shown in FIG. 2.

The switch 124 is arranged between the first terminal of the sampling capacitor 122 and the positive electrode terminal of the voltage source 123. The switch 124 shorts or opens the first terminal of the sampling capacitor 122 and the positive electrode terminal of the voltage source 123 in accordance with a third switch control signal (φ3).

Specifically, in the reset phase and the conversion phase of the differential voltage/time conversion circuit 11, the switch 124 shorts the first terminal of the sampling capacitor 122 and the positive electrode terminal of the voltage source 123. On the other hand, in the sample phase of the differential voltage/time conversion circuit 11, the switch 124 opens the first terminal of the sampling capacitor 122 and the positive electrode terminal of the voltage source 123.

As described above, the plurality of second sampling circuits may be arranged. If N (N is a natural number which is 2 or more) second sampling circuits are provided, supply of different voltages as the adjustment voltages $V_{DAC}$ shown in FIG. 2 can be realized by using voltages $V_{DAC1}$ to $V_{DACN}$ generated by a ladder resistor as shown in FIG. 3. N switches corresponding to the switches 124 in FIG. 2 are connected to output terminals of the respective voltages $V_{DAC}$, and the N switches short open the output terminals of the respective voltage $V_{DAC}$ and the N sampling capacitors. In this case, the adjustment voltages $V_{DAC1}$ to $V_{DACN}$ can be generated by using one reference voltage $V_{Ref}$.

The switch 131 of each bottom plate sampler 130 is arranged between the second terminals of the sampling capacitors 112 and 122 as well as the first input terminal of the comparator 141 and the bottom plate terminal $T_{BTM}$. The switch 131 shorts or opens the second terminals of the sampling capacitors 112 and 122 as well as the first terminal of the comparator 141 and the bottom plate terminal $T_{BTM}$ in accordance with the first switch control signal (φ1).

Specifically, in the sample phase of the differential voltage/time conversion circuit 11, the switch 131 shorts the second terminals of the sampling capacitors 112 and 122 as well as the first terminal of the comparator 141 and the bottom plate terminal $T_{BTM}$. On the other hand, in the reset phase and the conversion phase of the differential voltage/time conversion circuit 11, the switch 131 opens the second terminals of the sampling capacitors 112 and 122 as well as the first terminal of the comparator 141 and the bottom plate terminal $T_{BTM}$.

The first input terminal of the comparator 141 in the detector 140 is connected to the second terminals of the sampling capacitors 112 and 122 and the switch 131. The second input terminal of the comparator 141 is connected to the positive electrode terminal of the voltage source 142. The output terminal of the comparator 141 is connected to the control terminal of the current source 151 in the signal generator 150, and outputs the time signal $D_P$. The negative electrode terminal of the voltage source 142 is grounded. The voltage source 142 generates a comparative reference voltage $V_{RC}$.

In the conversion phase of the differential voltage/time conversion circuit 11, the comparator 141 compares a voltage of the first input terminal with a voltage of the second input terminal. In the sample phase and the reset phase of the differential voltage/time conversion circuit 11, the comparator 141 stops its operation.

Specifically, in the conversion phase of the differential voltage/time conversion circuit 11, if the voltage of the first input terminal is lower than the voltage of the second input terminal, the comparator 141 outputs the time signal $D_P$ on an "H (High)" level (a power supply voltage). On the other hand, if the voltage of the first input terminal is equal to or higher than the voltage of the second input terminal, the comparator 141 outputs the time signal $D_P$ on an "L (Low)" level (a ground voltage).

The first terminal of the current source 151 in the signal generator 151 is grounded. The second terminal of the current source 151 is connected to the first terminal of the sampling capacitor 112, the switch 111, and the switch 114.

The current source 151 receives the time signal $D_P$ from the comparator 141 through the control terminal. If the time signal $D_P$ is on the "H" level, the current source 151 generates a constant current signal, and supplies the constant current signal to the first terminal of the sampling capacitor 112. On the other hand, if the time signal $D_P$ is on the "L" level, the current source 151 stops its operation.

Figure 4:
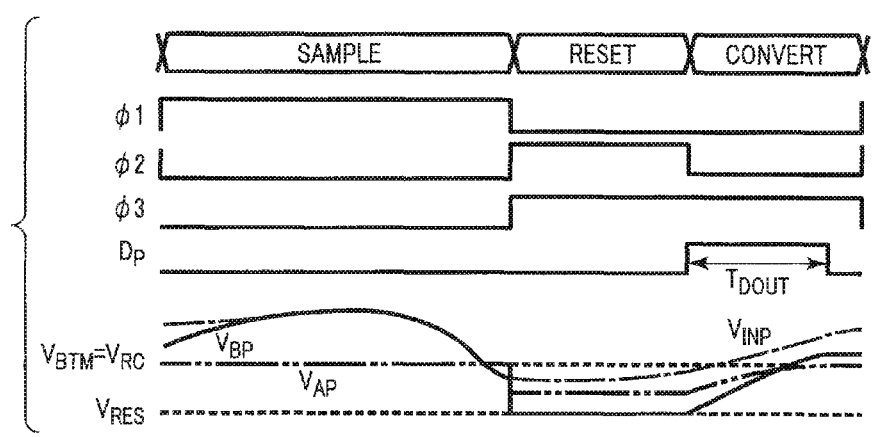
FIG. 4 is a timing chart showing charges in various signals in respective phases dividing operations of the differential voltage/time conversion circuit in the first embodiment.

As described above, the operation of the differential voltage/time conversion circuit 11 is divided by the sample phase, the reset phase, and the conversion phase. Various switch control signals, the time signal, and various node voltages in the sample phase, the reset phase, and the conversion phase vary as illustrated in FIG. 4. "SAMPLE" in FIG. 4 represents the sample phase, "RESET" in the same represents the reset phase, and "CONVERT" in the same represents the conversion phase. "SAMPLE", "RESET", and "CONVERT" in subsequent drawings represent the same.

In the sample phase, the first switch control signal (φ1) is on the "H" level, and the second switch control signal (φ2) and the third switch control signal (φ3) are on the "L" level. Furthermore, in the sample phase, the detector 140 does not operate. That is, in the sample phase, the differential voltage/time conversion circuit 11 charges the sampling capacitor 112 and the sampling capacitor 122 with a difference voltage between the input voltage $V_{INP}$ of the differential voltage/time conversion circuit 11 and the bottom plate voltage $V_{BTM}$.

In the reset phase, the first switch control signal (φ1) is on the "L" level, and the second switch control signal (φ2) and the third switch control signal (φ3) are on the "H" level. Moreover, in the reset phase, the detector 140 does not operate. That is, in the reset phase, the differential voltage/time conversion circuit 11 resets a voltage of the first terminal of the sampling capacitor 112 by using the reset voltage $V_{RES}$, and fixes the voltage of the first terminal of the sampling capacitor 122 by using the adjustment voltage $V_{DAC}$.

Here, a voltage $V_{A\_RES}$ in the reset phase of a node (which will be referred to as a node AP in the following description) whose potential is equal to that of the input terminal of the detector 140 can be derived as follows.

At the end of the sample phase, the sampling capacitor 112 and the sampling capacitor 122 store electric charges of $Ca\cdot(V_{INP}-V_{BTM})$ and $Cb\cdot(V_{INP}-V_{BTM})$, respectively.

According to the charge conservation, a total amount of the electric charges (Ca·Cb ($V_{INP}-V_{BTM}$)) stored in the sampling capacitor 112 and the sampling capacitor 122 in the sample phase does not vary in the reset phase. Therefore, the following Expression (1) can be achieved.

$$V_{A\_RES} = -V_{INP} + V_{BTM} + \frac{V_{RES} + V_{DAC}}{2} \quad (1)$$

Here, assuming that the input voltage $V_{INP}$ is constituted of a direct-current component and an alternating-current component, the alternating-current component is $V_{INAC}$, and the bottom plate voltage $V_{BTM}$ is designed to coincide with the direct-current component, the following Expression (2) can be achieved.

$$V_{A\_RES} = -V_{INAC} + \frac{V_{RES} + V_{DAC}}{2} \quad (2)$$

In the conversion phase, the first switch control signal (φ1) and the second switch control signal (φ2) are on the "L" level, and the third switch control signal (φ3) is on the "H" level. Moreover, in the conversion phase, the detector 140 operates. That is, in the conversion phase, the differential voltage/time conversion circuit 11 disconnects the first terminal of the sampling capacitor 112 from the voltage source 113. The comparator 141 detects whether a voltage $V_{AP}$ of the node AP is less than the comparative reference voltage $V_{RC}$, and outputs the time signal $D_P$ on the "H" level over a first period during which $V_{AP}<V_{RC}$ is achieved. In addition, it is assumed that the reset voltage $V_{RES}$, the voltage $V_{DAC}$, and the comparative reference voltage $V_{RC}$ are determined so that $V_{AP}<V_{RC}$ is achieved at the start of the conversion phase.

The current source 151 supplies the constant current signal to the first terminal of the sampling capacitor 112 over the first period. Since the sampling capacitor 112 is connected with the sampling capacitor 122 in series as seen from the current source 151, this constant current signal charges the sampling capacitor 112 and the sampling capacitor 122. Thus, the voltage $V_{AP}$ of the node AP rises with time, and coincides with the comparative reference voltage $V_{RC}$ eventually (at the end of the first period).

The sampling capacitor 112 is connected with the sampling capacitor 122 in series as seen from the current source 151, and a voltage $V_{BP}$ of a node (which will be referred to as a node BP hereinafter) whose potential is equal to that of the first terminal of the sampling capacitor 112 is equal to $V_{RES}$ at the start of the conversion phase. Thus, a voltage $V_{B\_CNV}$ of the node BP at the end of the first period can be calculated by using the following Expression (3).

$$V_{B\_CNV} = \frac{1}{C_a/2} \int_0^{T_{DOUT}} I_{151} dt + V_{RES} \quad (3)$$
$$= 2 \cdot \frac{I_{151} \cdot T_{DOUT}}{C_a} + V_{RES}$$

In Expression (3), $T_{DOUT}$ represents a time length of the first period, and $I_{151}$ represents an amount of current the constant current signal supplied by the current source 151 has.

Additionally, considering voltage division carried out by the sampling capacitor 112 and the sampling capacitor 122, if Ca equals Cb, an increment of the voltage $V_{AP}$ of the node AP during first period corresponds to a half of an increment of the voltage of the node BP during the first period. Further, the voltage $V_{AP}$ of the node AP at the start of the conversion phase is equal to $V_{A\_RES}$. Thus, the voltage $V_{A\_CNV}$ of the node AP at the end of the first period can be calculated by using the following Expression (4).

$$V_{A\_CNV} = \frac{I_{151} \cdot T_{DOUT}}{C_a} + V_{A\_RES} \quad (4)$$

As described above, at the end of the first period, the voltage $V_{AP}$ of the node AP coincides with the comparative reference voltage $V_{RC}$. Thus, the time length $T_{DOUT}$ of the first period can be derived by using the following Expressions (5) and (6).

$$V_{A\_CNV} = V_{RC} \quad (5)$$
$$\frac{I_{151} \cdot T_{DOUT}}{C_a} + V_{A\_RES} = V_{RC}$$

$$T_{DOUT} = \frac{C_a}{I_{151}} \left( V_{INAC} + V_{RC} - \frac{V_{RES} + V_{DAC}}{2} \right) \quad (6)$$

As understood from Expression (6), the time length. $T_{DOUT}$ of the first period is proportionate to a sum of a residual between the alternating-current components $V_{INAC}$ and $V_{DAC}/2$ of the input voltage $V_{INP}$ and the direct-current component of the same. That is, the time signal $D_P$ represents the time length $T_{DOUT}$ that is dependent on the input voltage $V_{INP}$.

A proportionality coefficient can be set to a desired value by appropriately designing $I_{151}$ and Ca. The direct-current component can be set to a desired value by appropriately designing $V_{RC}$, $V_{RES}$, and $V_{DAC}$.

Further, in the negative converter 11N, the input voltage $V_{INN}$ is input to the switches 111 and 121. The negative converter 11N performs voltage/time conversion to the input voltage. $V_{INN}$, and outputs the time signal $D_N$ from the comparator 141. Since other structures and operations of the negative converter 11N are the same as those of the positive converter 11P, a description thereof will be omitted.

1.2 Differential Time/Voltage Conversion Circuit

Figure 5:
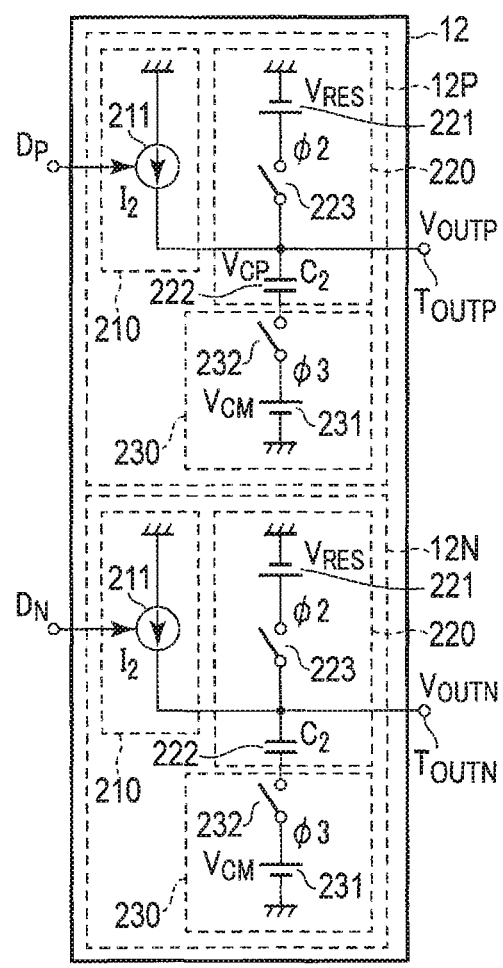
FIG. 5 is a circuit diagram showing a configuration of the differential time/voltage conversion circuit in the first embodiment.

FIG. 5 is a circuit diagram showing a configuration of the differential time/voltage conversion circuit 12. As shown in the drawing, the differential time/voltage conversion circuit 12 includes a positive converter 12P and a negative converter 12N. The positive converter 12P performs time/voltage conversion to the time signal $D_P$, and outputs a voltage signal $V_{OUTP}$. The negative converter 12N performs time/voltage conversion to the time signal $D_N$, and outputs a voltage signal $V_{OUTN}$. The positive converter 12P and the negative converter 12N outputs the voltage signals $V_{OUTP}$ and $V_{OUTN}$ to the common mode feedback circuit 13.

The positive converter 12P includes a signal generator 210, a third sampling circuit 220, and a bottom plate sampler 230. The signal generator 210 includes a current source 211. The current source 211 includes a first terminal, a second terminal, and a control terminal. The third sampling circuit 220 includes a voltage source 221, a sampling capacitor 222, and a switch 223. The voltage source 221 has a positive electrode terminal and a negative electrode terminal. The sampling capacitor 222 has a first terminal and a second terminal. The bottom plate sampler 230 includes a voltage source 231 and a switch 232. The voltage source 231 has a positive electrode terminal and a negative electrode terminal.

The first terminal of the current source 211 in the signal generator 210 is grounded. The second terminal of the current source 211 is connected to the first terminal of the sampling capacitor 222, the switch 223, and the output terminal $T_{OUTP}$. The time signal $D_P$ is input to the control terminal of the current source 211. The current source 211 of the signal generator 210 receives the time signal $D_P$ from the differential voltage/time conversion circuit 11 through the control terminal. If the time signal $D_P$ is on the "H" level, the current source 211 generates a constant current signal, and supplies the constant current signal to the first terminal of the sampling capacitor 222. On the other hand, if the time signal $D_P$ is on the "L" level, the current source 211 stops its operation.

The positive electrode terminal of the voltage source 221 in the third sampling circuit 220 is connected to the switch 223. The negative electrode terminal of the voltage source 221 is grounded. The voltage source 221 generates the reset voltage $V_{RES}$.

The first terminal of the sampling capacitor 222 is connected to the second terminal of the current source 211, the switch 223, and the output terminal $T_{OUTP}$. The second terminal of the sampling capacitor 222 is connected to the switch 232. A capacitance of the sampling capacitor 222 is assumed to be $C_2$·$C_2$ is typically designed to coincide with a constant multiple of Ca. This constant may be, e.g., an inverse number of a gain of an amplification circuit (an amplification, factor) including the differential voltage/time conversion circuit 11 and the differential time/voltage conversion circuit 12. For example, if a gain is two times, $C_2$=approximately Ca/2 could be set.

The switch 223 is arranged between the first terminal of the sampling capacitor 222 and the positive electrode terminal of the voltage source 221. The switch 223 shorts or opens the first terminal of the sampling capacitor 222 and the positive electrode terminal of the voltage source 221 in accordance with the second switch control signal (φ2).

Specifically, in the reset phase of the differential time voltage conversion circuit 12, the switch 223 shorts the first terminal of the sampling capacitor 222 and the positive electrode terminal of the voltage source 221. On the other hand, in the sample phase and a hold phase of the differential time/voltage conversion circuit 12, the switch 223 opens the first terminal of the sampling capacitor 222 and the positive electrode terminal of the voltage source 221.

The positive electrode terminal of the voltage source 231 in the bottom plate sampler 230 is connected to the switch 232. The negative electrode terminal of the voltage source 231 is grounded. The voltage source 231 generates an intermediate voltage $V_{CM}$.

The switch 232 is arranged between the second terminal of the sampling capacitor 222 and the positive electrode terminal of the voltage source 231. The switch 232 shorts or opens the second terminal of the sampling capacitor 222 and the positive electrode terminal of the voltage source 231 in accordance with the third switch control signal (φ3).

Specifically, in the reset phase and the sample phase of the differential time/voltage conversion circuit 12, the switch 232 shorts the second terminal of the sampling capacitor 222 and the positive electrode terminal of the voltage source 231. On the other hand, in the hold phase of the differential time/voltage conversion circuit 12, the switch 232 opens the second terminal of the sampling capacitor 222 and the positive electrode terminal of the voltage source 231.

Figure 6:
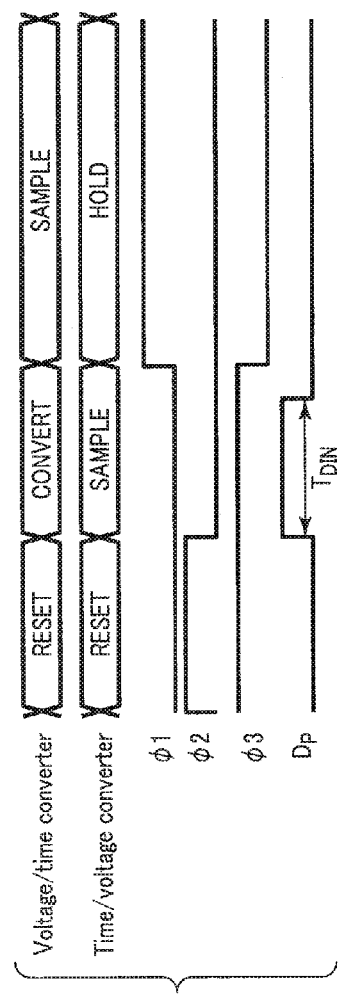
FIG. 6 is a timing chart showing changes in various signals in respective phases dividing operations of the differential time/voltage conversion circuit in the first embodiment.

As described above, an operation of the differential time/voltage conversion circuit 12 is divided by the reset phase, the sample phase, and the hold phase. Various switch control signals and time signals in the reset phase, the sample phase, and the hold phase vary as illustrated in FIG. 6. "HOLD" in FIG. 6 represents the hold phase. "HOLD" in subsequent drawings represents the same.

In the reset phase, the first switch control signal (φ1) is on the "L" level, and the second switch control signal (φ2) and the third switch control signal (φ3) are on the "H" level. The reset phase of the differential time/voltage conversion circuit 12 is aligned with the reset phase of the differential voltage/time conversion circuit 11 in terms of time.

That is, in the reset phase, the differential time/voltage conversion circuit 12 resets a voltage of the first terminal of the sampling capacitor 222 by using the reset voltage $V_{RES}$, and fixes a voltage of the second terminal of the sampling capacitor 222 by using the intermediate voltage $V_{CM}$.

In the sample phase, the first switch control signal (φ1) and the second switch control signal (φ2) are on the "L" level, and the third switch control signal (φ3) is on the "H" level. The sample phase of the differential time/voltage conversion circuit 12 is aligned with the conversion phase of the differential voltage/time conversion circuit 11 in terms of time.

That is, in the sample phase, the differential time/voltage conversion circuit 12 disconnects the first terminal of the sampling capacitor 222 from the voltage source 221. Since the current source 221 receives the time signal $D_P$ on the "H" level over the first period, it supplies the constant current signal to the third sampling circuit 220 over the first period. This constant current signal flows through a current path formed of the sampling capacitor 222, the switch 232, and the voltage source 231. Since this constant current signal charges the sampling capacitor 222, a voltage of the first terminal of the sampling capacitor 222 rises with time.

A voltage $V_{CP}$ of a node (which will be referred to as a node CP hereinafter) whose potential is equal to that of the first terminal of the sampling capacitor 222 is equal to $V_{RES}$ at the start of the sample phase. Thus, a voltage $V_{C\_SMP}$ of the node CP at the end of the first period can be calculated by using the following Expression 7).

$$V_{C\_SMP} = \frac{1}{C_2} \int_0^{T_{DIN}} I_{211}\, dt + V_{RES} \qquad (7)$$
$$= \frac{I_{211} T_{DIN}}{C_2} + V_{RES}$$

In Expression (7), $T_{DIN}$ represents a length of the first period, and $I_{211}$ represents a current amount the constant current signal supplied by the current source 211 has.

In the hold phase, the first switch control signal (φ1) is on the "H" level, and the second switch control signal (φ2) and the third switch control signal (φ3) are on the "L" level. The bold phase of the differential time/voltage conversion circuit 12 is aligned with the sample phase of the differential voltage/time conversion circuit 11 in terms of time.

In the hold phase, the differential time/voltage conversion circuit 12 disconnects the first terminal of the sampling capacitor 222 from the voltage source 221, and disconnects the second terminal of the sampling capacitor 222 from the voltage source 231.

At the end of the sampling phase, the sampling capacitor 222 has electric charges of $C_2 \cdot (V_{C\_SMP} - V_{CM})$ stored therein. According to the charge conservation, a total amount of the electric charges stored in the sampling capacitor 222 in the sample phase does not vary in the hold phase. Therefore, the following Expression (8) can he achieved in regard to the output voltage $V_{OUTP}$ of the differential/voltage conversion circuit 12.

$$V_{OUTP} = \frac{I_{211} T_{DIN}}{C_2} - V_{RES} + 2V_{CM} \qquad (8)$$

If $T_{DIN}$ of Expression. (8) coincides with $T_{DOUT}$ shown in Expression (6), Expression (8) can be rewritten into the following Expression. (9).

$$V_{OUTP} = \frac{I_{211}}{C_2} \cdot \frac{C_a}{I_{151}} \left( V_{INAC} + V_{RC} - \frac{V_{RES} + V_{DAC}}{2} \right) - V_{RES} + 2V_{CM} \qquad (9)$$

Moreover, if $C_2 = Ca/2$ and $I_{211} = I_{151}$, Expression (9) can be rewritten into the following Expression (10).

$$V_{OUTP} = -2V_{INAC} - 2V_{RC} + V_{DAC} + 2V_{CM} \qquad (10)$$

Additionally, if $V_{CM} = V_{RC}$, Expression (10) can be rewritten into the following Expression (11).

$$V_{OUTP} = -2V_{INAC} = V^{DAC} \qquad (11)$$

As understood from Expression (11), the output voltage $V_{OUTP}$ is equal to a voltage provided by multiplying the alternating-current component ($V_{INAC}$) of the input voltage $V_{INP}$ by −2 and adding the adjustment voltage $V_{DAC}$. In other words, it is equal to taking a residual between $V_{INAC}$ and $V_{DAC}/2$ and multiplying it by −2. Further, if $V_{DAC}$ is equal to the direct-current component of the input voltage $V_{INP}$, the alternating-current $V_{INAC}$ can be amplified to −2 times while fixing the direct-current component of the input voltage $V_{IND}$ based on the above numerical example.

As described above, the amplification circuit including the differential voltage/time conversion circuit 11 and the differential time/voltage conversion circuit 12 resets the sampling capacitor on the input side and the sampling capacitor on the output side at the same timing by using the same reset voltage, and then amplifies the input voltage. Thus, according to this amplification circuit, a mismatch of the input and output voltages at the start of the amplifying operation can be alleviated. Furthermore, this amplification circuit, does not include a switch that shorts the input and the output. Thus, a reduction in isolation between the input and the output and nonlinear distortions of the switch do not occur. Therefore, according to this amplification circuit, power consumption can be reduced, and an accuracy can be improved.

Moreover, in the negative converter 12N, the time signal $D_N$ is input to the current source 211. The negative converter 12N performs time/voltage conversion to the time signal $D_N$, and outputs the voltage $V_{OUTN}$ from the output terminal $T_{OUTN}$. Other structures and operations of the negative converter 12N are the same as those of the positive converter 12P, and a description thereof will be omitted.

1.3 Common Mode Feedback Circuit

Figure 7:
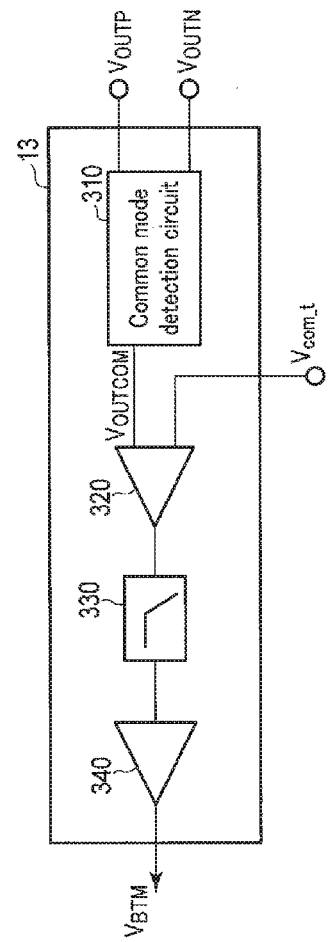
FIG. 7 is a view showing a structural example of a common mode feedback circuit in the first embodiment.

FIG. 7 is a view showing a structural example of the common mode feedback circuit 13. The common mode feedback circuit 13 includes a common mode detection circuit 310, an error amplifier 320, a filter 330, and a buffer circuit 340. Here, a description will be given as to a case where the common mode detection circuit 310, the error amplifier 320, the filter 330, and the buffer circuit 340 are provided, but the common mode feedback circuit 13 could have at least the common mode detection circuit 310 and the error amplifier 320.

The common mode detection circuit 310 detects a common mode voltage $V_{OUTCOM}$ from the voltage signals $V_{OUTP}$ and $V_{OUTN}$ output from the differential time/voltage conversion circuit 12. The error amplifier 320 compares tie common mode voltage $V_{OUTCOM}$ with the target voltage $V_{COMt}$, and outputs the bottom plate voltage $V_{BTM}$ in accordance with a comparison result.

The filter 330 limits a band of the bottom plate voltage $V_{BTM}$ output from the error amplifier 320. The buffer circuit 340 amplifies the bottom plate voltage $V_{BTM}$ output from the filter 330, and outputs a resultant to the bottom plate terminal $V_{BTM}$ of the differential voltage/time conversion circuit 11.

2. Operation of Amplification Circuit An operation to stabilize the common mode voltage $V_{OUTCOM}$ in the amplification circuit 10 will now be described hereinafter.

FIG. 8 is a timing chart showing an operation of the amplification circuit according to the first embodiment, and it is a timing chart showing changes in various signals in the respective divided phases.

As shown in the drawing, the differential voltage/time conversion circuit 11 repeats the operation in the order of the sample phase (n), the reset phase (n), the conversion phase (n), and the sample phase (n+1). n represents fetched data. The differential time/voltage conversion circuit 12 repeats the operation in the order of the hold phase (n−1), the reset phase (n), the sample phase (n), and the hold phase (n) corresponding to the phases in the differential voltage/time conversion circuit 11, respectively. In the reset phase, the voltage $V_{AP}$ can be represented by the following Expression (12).

$$V_{AP\_RES} = -V_{INP} + V_{BTM} + \frac{C_a V_{RES} + C_b V_{DAC}}{C_a + C_b} \qquad (12)$$

Moreover, a time signal $T_{DOUTP}$ of the differential voltage/time conversion circuit 11 can be represented by the following Expression (13).

$$T_{DOUTP} = \left( V_{INP} - V_{BTM} + V_{RC} - \frac{C_a V_{RES} + C_b V_{DAc}}{C_a + C_b} \right) \times \frac{C_b}{I_1} \qquad (13)$$

Additionally, the voltage signal $V_{OUTP}$ of the differential time/voltage conversion circuit can be represented by the following Expression (14).

$$V_{OUTP} = \left( V_{INP} - V_{BTM} + V_{RC} - \frac{C_a V_{RES} + C_b V_{DAC}}{C_a + C_b} \right) \times \frac{C_b I_2}{C_2 I_1} + V_{RES} \qquad (14)$$

Here, a gain is $(Cb \cdot I2)/(C_2 \cdot I1)$.

The common mode voltage $V_{OUTCOM}$ can be represented by the following Expression (15).

$$V_{OUTCOM} = \qquad (15)$$
$$\left( \frac{V_{INP} + V_{INN}}{2} - V_{BTM} + V_{RC} - \frac{C_a V_{RES} + C_b V_{DAC}}{C_a + C_b} \right) \times \frac{C_b I_2}{C_2 I_2} + V_{RES}$$

Here, the gain is likewise $(Cb \cdot I2)/(C_2 \cdot I1)$.

As understood from the Expression (15), when the bottom plate voltage $V_{BTM}$ is adjusted in the same voltage changing direction as a fluctuation of the common mode voltage $V_{OUTCOM}$, namely, when the common mode voltage $V_{OUTCOM}$ rises, the bottom plate voltage $V_{BTM}$ is increased. When the common mode voltage $V_{OUTCOM}$ lowers, the bottom plate voltage $V_{BTM}$ is decreased, whereby the common mode voltage $V_{OUTCOM}$ can be stabilized. For example, when the common mode voltage $V_{OUTCOM}$ is higher than the target voltage $V_{COM\_t}$, the error amplifier 320 adjusts the bottom plate voltage $V_{BTM}$ to increase. On the other hand, when the common mode voltage $V_{OUTCOM}$ is lower than the target voltage $V_{COM\_t}$, the error amplifier 320 adjusts the bottom plate voltage $V_{BTM}$ to decrease. As a result, even if the common mode voltage of the input voltages $V_{INP}$ and $V_{INN}$ fluctuates, the common mode voltage $V_{OUTCOM}$ can be converged on the target voltage $V_{COM\_t}$ and stabilized. The adjustment of this bottom plate voltage $V_{BTM}$ can be realized by forming a common mode feedback loop.

3. Other Circuit Examples

Figure 9:
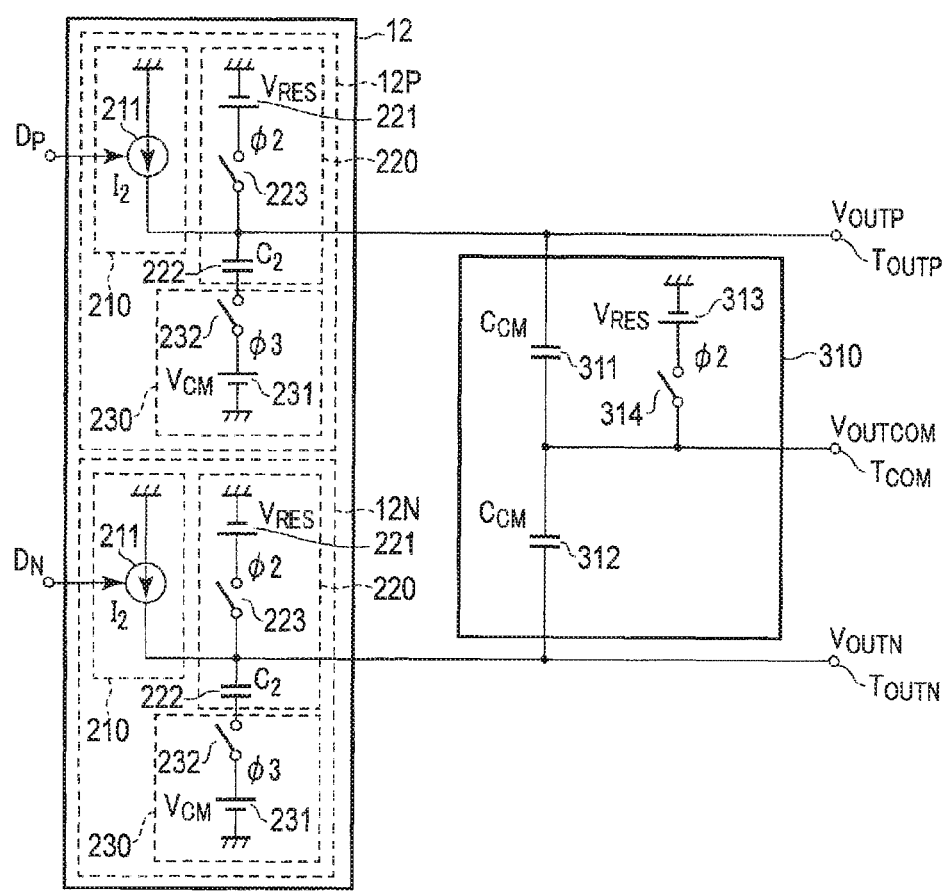
FIG. 9 is a circuit diagram showing a structural example of the differential time/voltage conversion circuit and a common mode detection circuit in the first embodiment.

FIG. 9 is a circuit diagram showing an example of a differential time/voltage conversion circuit 12 and a common mode detection circuit 310. As shown in the drawing, the differential time/voltage conversion circuit 12 includes the same configuration as that shown in FIG. 5. The switched capacitor type common mode detection circuit 310 includes capacitors 311 and 312, a voltage source 313, and a switch 314.

The capacitors 311 and 312 connected in series are arranged between an output terminal $T_{OUTP}$ and an output terminal $T_{OUTN}$. A node between the capacitor 311 and the capacitor 312 is connected to an output terminal $T_{COM}$. The switch 314 is arranged between the node between the capacitor 311 and the capacitor 312 and a positive electrode terminal of the voltage source 313. A negative electrode terminal of the voltage source 313 is grounded. Further, a common mode voltage $V_{OUTCOM}$ is output from the output terminal $T_{COM}$.

Figure 10:
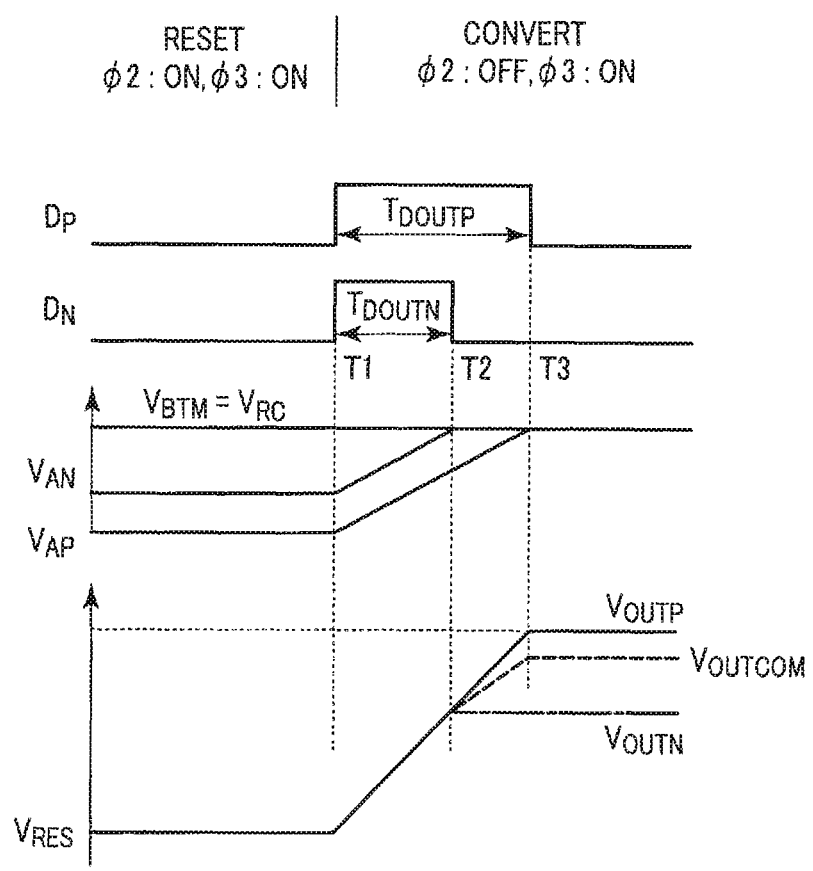
FIG. 10 is a timing chart showing an operation of the circuits depicted in FIG. 9.

FIG. 10 shows an operation in the circuit depicted in FIG. 9. Based on time signals $D_P$ and $D_N$ output from a differential voltage/time conversion circuit 11, the common mode voltage $V_{OUTCOM}$ is detected by using the differential time/voltage conversion circuit 12 and the common mode detection circuit 310.

In the reset phase, a switch 223 is shorted by using a second switch control signal (φ2), and a switch 232 is shorted by using a third switch control signal (φ3), thereby resetting a sampling capacitor 222 of the differential time/voltage conversion circuit 12. As a result, the sampling capacitor 222 is charged with a voltage which is a difference between a voltage $V_{RES}$ and a voltage $V_{VCM}$. At the same time, the switch 314 is shorted by using the second switch control signal (φ2), thereby resetting the capacitors 311 and 312 of the common mode detection circuit 310.

In the conversion phase, when the switch 223 is opened by using the second switch control signal (φ2) and the switch 232 is shorted by using the third switch control signal (φ3), a current corresponding to the voltage that has charged the sampling capacitor 222 is supplied to the sampling capacitor 222 of the differential time/voltage conversion circuit 12 from a current source 211. At the same time, the switch 314 of the common mode detection circuit 310 is opened by using the second switch control signal (φ2).

A time T1 represents a time that the switch 223 is opened by the second switch control signal (φ2) and charging a first terminal of the sampling capacitor 222 of each of a positive converter 12P and a negative converter 12N begins. A time T2 represents a time that charging the first terminal of the sampling capacitor 222 of the negative converter 12N is finished. A time T3 represents a time that charging the first terminal of the sampling. capacitor 222 of the positive converter 12P is finished. That is, in the conversion phase, the time T1 represents a time that conversion of the time signals $D_P$ and $D_N$ into the voltage signals is started. The time T2 represents a time that the conversion of the time signal $D_N$ into the voltage signal is finished. The time T3 represents a time that the conversion of the time signal $D_P$ into the voltage signal is finished.

A voltage $V_{OUTN}$ linearly rises during a period (T1-T2), and turns to a fixed voltage at and after the time T2. A voltage $V_{OUTP}$ linearly rises during a period (T1-T3), and turns to a fixed voltage at and after the time T3. In this case, since a load state differs depending on the period (T1-T2) that the voltage $V_{OUTP}$ nd the voltage $V_{OUTN}$ operate in a common mode and a period (T2-T3) that they operate in a differential mode, an error may be produced in detection of the common mode voltage $V_{OUTCOM}$ in some cases, but the operation can be performed in the embodiment without any problem.

AD Conversion Circuit

A description will be given as to an example where amplification circuit according to the first embodiment applied to a pipeline type AD conversion circuit.

4.1 Configuration of AD Conversion Circuit.

Figure 11:
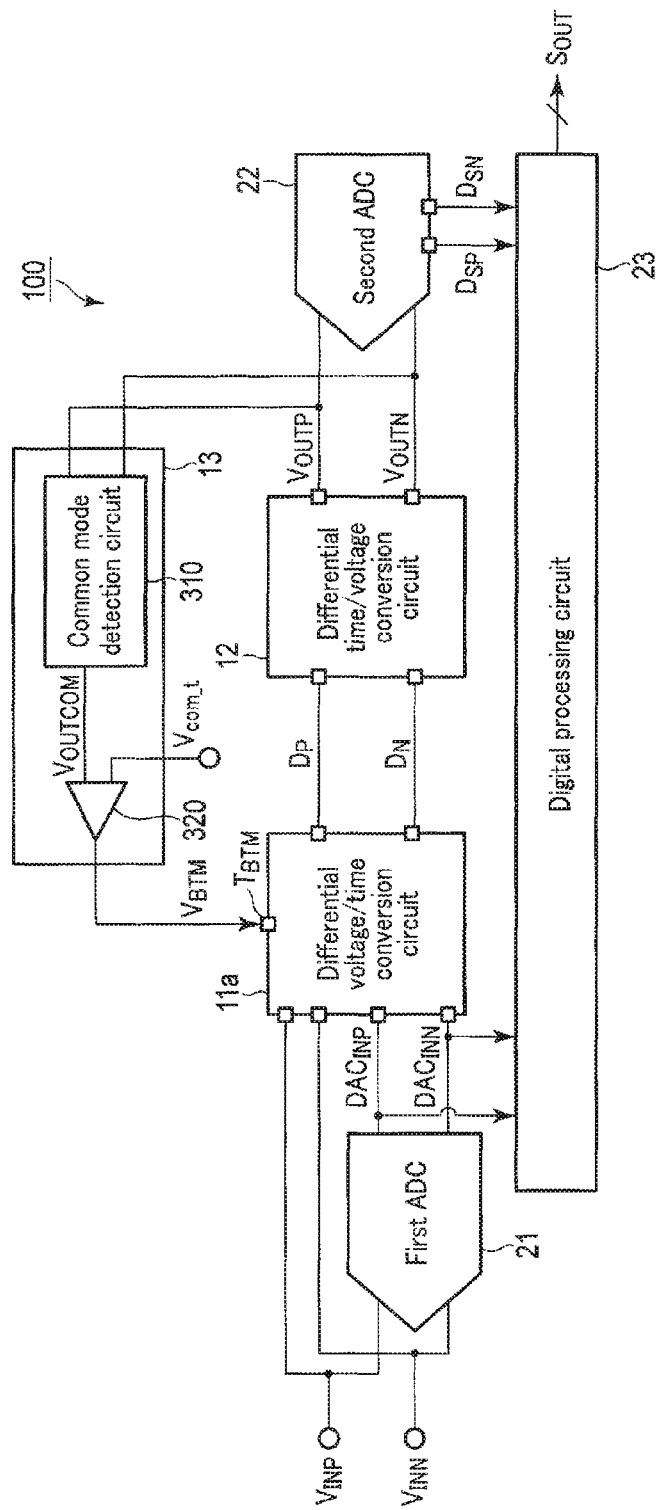
FIG. 11 is a block diagram showing a configuration of an AD conversion circuit using the amplification circuit depicted in FIG. 1.

FIG. 11 is a block diagram showing a configuration of an AD conversion circuit using the amplification circuit depicted in FIG. 1. As shown in the drawing, the AD conversion circuit 100 includes a first analog/digital converter (ADC) 21, a differential voltage/time conversion circuit 11a, differential time/voltage conversion circuit 12, a common mode feedback circuit 13, a second analog/digital converter (ADC) 22, and a digital processing circuit 23.

An outline of an operation of the AD conversion circuit will now be described hereinafter.

The first analog/digital converter 21 performs analog/digital conversion to an input voltage $V_{INP}$ to generate a digital signal $DAC_{INP}$, and performs analog/digital conversion to an input voltage $V_{INN}$ to generate a digital signal $DAC_{INN}$. The input voltages $V_{INP}$ and $V_{INN}$ constitute a differential signal. The first analog/digital converter 21 outputs the digital signal $DAC_{INP}$ and the digital signal $DAC_{INN}$ to the differential voltage/time conversion circuit 11a and the digital processing circuit 23.

The differential voltage/time conversion circuit 11a has a voltage/time converting function and also has a digital/analog converting function. That is, the differential voltage/time conversion circuit 11a acquires a first voltage (a residual signal) which is a difference between the input voltage $V_{INP}$ and a voltage corresponding to a result of converting the digital signal $DAC_{INP}$ into an analog signal, and performs voltage/time conversion to the first voltage to generate a time signal $D_P$. Further, the differential voltage/time conversion circuit 11a acquires a second voltage (a residual signal) which is a difference between the input voltage $V_{INN}$ and a voltage corresponding to a result of converting the digital signal $DAC_{INN}$ into an analog signal, and performs voltage/time conversion to the second voltage to generate a time signal $D_N$. The differential time/voltage conversion circuit 12 performs time/voltage conversion to the time signals $D_P$ and $D_N$ to restore the first and second voltages, and generates voltage signals $V_{OUTP}$ and $V_{OUTN}$, respectively. The differential time/voltage conversion circuit 12 outputs the voltage signals $V_{OUTP}$ and $V_{OUTN}$ to the second analog/digital converter 22.

The second analog/digital converter 22 performs analog/digital conversion to the voltage signals $V_{OUTP}$ and $V_{OUTN}$ to provide digital signals $D_{SP}$ and $D_{SN}$, respectively. The second analog/digital converter 22 outputs the digital signals $D_{SP}$ and $D_{SN}$ to digital processing circuit 23. The digital processing circuit 23 outputs a digital signal $S_{OUT}$ based or the digital signals $DAC_{INP}$ and $DAC_{INN}$ and the digital signals $D_{SP}$ and $D_{SN}$.

4.2 Configuration of Differential Voltage/Time Conversion Circuit

The differential voltage/time conversion circuit 11a will now be described in detail hereinafter. The first and second analog/digital converters (ADC) 21 and 22 have normal configurations, and configurations of the differential time/voltage conversion circuit 12 and the common mode feedback circuit 13 are the same as the first embodiment, thereby omitting a description thereof.

Figure 12:
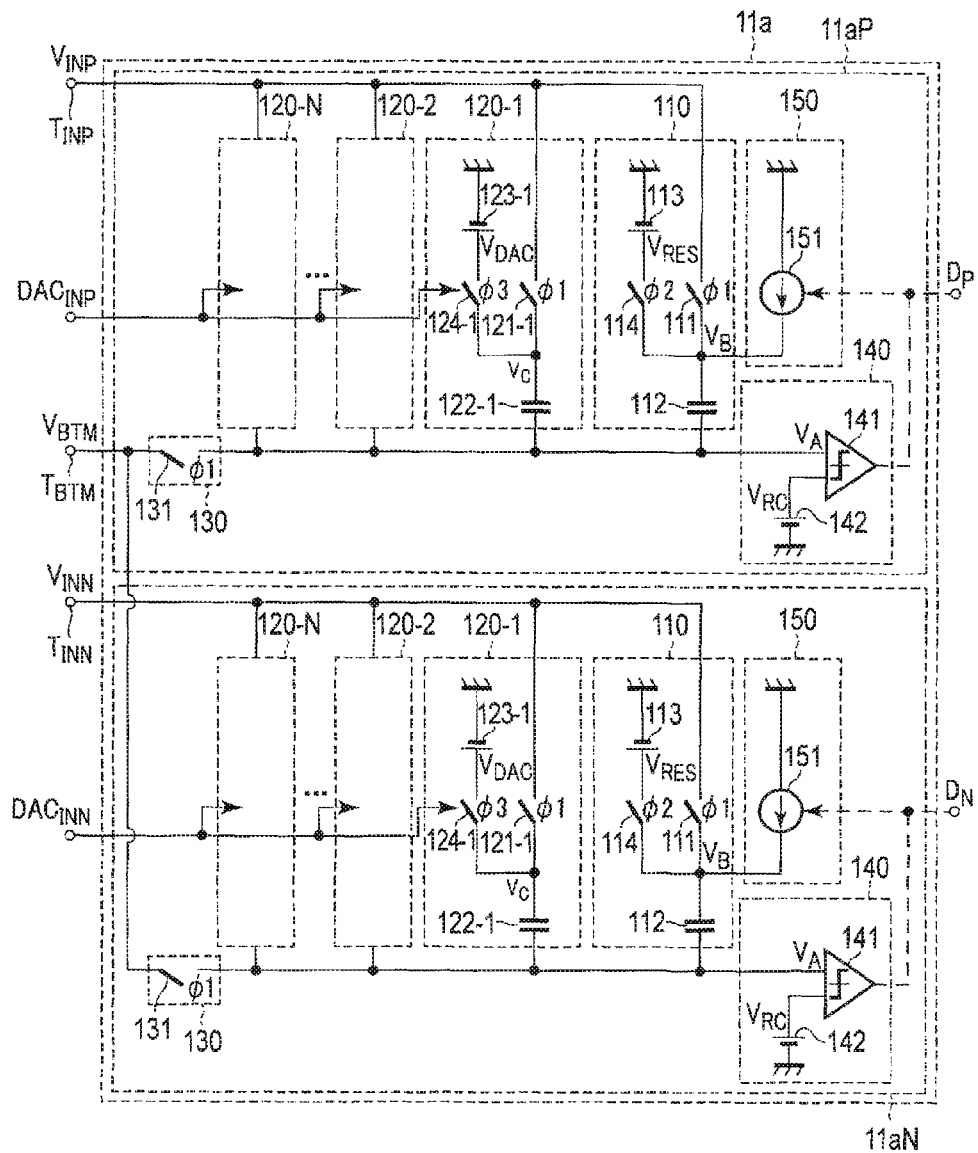
FIG. 12 is a circuit diagram showing a configuration of a differential voltage/time conversion circuit 11a of the AD conversion circuit depicted in FIG. 11.

FIG. 12 is a circuit, diagram showing a configuration of the differential voltage/time conversion circuit 11a.

As shown in the drawing, the differential voltage/time conversion, circuit 11a includes a positive converter 11aP and a negative converter 11aN. The positive converter 11aP performs voltage/time conversion to a first voltage which is a difference between the input voltage $V_{INP}$ and a voltage corresponding to a result of performing digital/analog conversion to the digital signal $DAC_{INP}$, and outputs the time signal $D_P$. In detail, the digital signal $DAC_{INP}$ is restored to an analog voltage, and a difference between this analog voltage and the input voltage $V_{INP}$ (the first voltage) is taken. As a result, a voltage portion (which will be referred to as a residual hereinafter) of the input voltage $V_{INP}$ which has failed to be converted into the digital signal by the first analog/digital converter 21 is provided, and the residual is converted into the time signal $D_P$ to amplify this residual. It is to be noted that, subsequently, the time signal $D_P$ is converted into a voltage signal $V_{OUTP}$ by the differential time/voltage conversion circuit 12, and it is converted into a digital signal $D_{SP}$ by the second analog/digital converter 22. Consequently, the residual that has failed to be converted into the digital signal of the input voltage $V_{INP}$ is converted into the digital signal $D_{SP}$.

The negative converter 11aN performs voltage/time conversion to a second voltage which is a difference between the input voltage $V_{INN}$ and a voltage corresponding to a result of performing digital/analog conversion to the digital signal $DAC_{INN}$, and outputs the time signal $D_N$. Here, likewise, the digital signal $DAC_{INN}$ is restored to an analog voltage, and a difference (the second voltage) between this analog voltage and the input voltage $V_{INN}$ is taken. Consequently, a voltage portion (which will be referred to as a residual hereinafter) which has failed to be converted into a digital signal in the input voltage $V_{INN}$ is provided, and the residual is converted into the time signal $D_N$ to amplify this residual. The positive converter 11aP and the negative converter 11aN output the time signals $D_P$ and $D_N$ to the differential time/voltage conversion circuit 12, respectively. The positive converter 11aP and the negative converter 11aN have a common bottom plate terminal $T_{BTM}$. The bottom plate voltage $V_{BTM}$ is supplied to the bottom plate terminal $T_{BTM}$.

The positive converter 11aP includes a first sampling circuit 110, second sampling circuits 120-1, . . . , and 120-N, a bottom plate sampler 130, a detector 140, and a signal generator 150. Here, to simplify the description, a description will be given as to an example where the single second sampling circuit 120-1 is provided as the second sampling circuit.

The second sampling circuit 120-1 includes a switch 121-1, a sampling capacitor 122-1, a voltage source 123-1, and a switch 124-1. The sampling capacitor 122-1 has a first terminal and a second terminal. The voltage source 123-1 has a positive electrode terminal and a negative electrode terminal.

A switch 111 of the first sampling circuit 110 is interposed between the input terminal $T_{INP}$ and the first terminal of the sampling capacitor 112. The switch 111 shorts or opens the input terminal $T_{INP}$ and the first terminal of the sampling capacitor 112 in accordance with the first switch control signal ($\phi 1$).

Specifically, in the sample phase of the differential voltage/time conversion circuit 11a, the switch 111 shorts the input terminal $T_{INP}$ and the first terminal of the sampling capacitor 112. On the other hand, in the reset phase and the conversion phase of the differential voltage/time conversion circuit 11a, the switch 111 opens the input terminal $T_{INP}$ and the first terminal of the sampling capacitor 112.

The first terminal of the sampling capacitor 112 is connected to the switch 111, the switch 114, and the current source 151 of the signal generator 150. The second terminal of the sampling capacitor 112 is connected to the switch 131 of the bottom plate sampler 130, the second terminal of the sampling capacitor 122-1, and the first input terminal of the comparator 141 in the detector 140. The capacitance of the sampling capacitor 112 is assumed to be Ca.

The positive electrode terminal of the voltage source 113 is connected to the switch 114. The negative electrode terminal of the voltage source 113 is grounded. The voltage source 113 generates the reset voltage $V_{RES}$.

The switch 114 is interposed between the first terminal of the sampling capacitor 112 and the positive electrode terminal of the voltage source 113. The switch 114 shorts opens the first terminal of the sampling capacitor 112 and the positive electrode terminal of the voltage source 113 in accordance with the second switch control signal ($\phi 2$).

Specifically, in the reset phase of the differential voltage/time conversion circuit 11a, the switch 114 shorts the first terminal of the sampling capacitor 112 and the positive electrode terminal of the voltage source 113. On the other hand, in the sample phase and the conversion phase of the differential voltage/time conversion circuit 11a, the switch 114 opens the first terminal of the sampling capacitor 112 and the positive electrode terminal of the voltage source 113.

The switch 121-1 of the second sampling circuit 120-1 is interposed between the input, terminal $T_{INP}$ and the first terminal of the sampling capacitor 122-1. The switch 121-1 shorts or opens the input terminal $T_{INP}$ and the first terminal of the sampling capacitor 122-1 in accordance with the first switch control signal ($\phi 1$).

Specifically, in the sample phase of the differential voltage/time conversion circuit 11a, the switch 121-1 shorts the input, terminal $T_{INP}$ and the first terminal of the sampling capacitor 122-1. On the other hand, in the reset phase and the conversion phase of the differential voltage/time conversion circuit 11a, the switch 121-1 opens the input terminal $T_{INP}$ and the first terminal of the sampling capacitor 122-1.

The first terminal of the sampling capacitor 122-1 is connected to the switch 121-1 and the switch 124-1 in common. The second terminal of the sampling capacitor 122-1 is connected to the switch 131 of the bottom plate sampler 130, the second terminal of the sampling capacitor 112, and the first input terminal of the comparator 141 in the detector 140. A capacitance of the sampling capacitor 122-1 is assumed to Cb.

The positive electrode terminal of the voltage source 123-1 is connected to the switch 124-1. The negative electrode terminal of the voltage source 123-1 is grounded. The voltage source 123-1 generates the adjustment voltage $V_{DAC}$. This voltage $V_{DAC}$ may be controlled by a control signal which is not shown in FIG. 12.

The switch 124-1 is interposed between the first terminal of the sampling capacitor 122-1 and the positive electrode terminal of the voltage source 123-1. The switch 124-1 shorts or opens the first terminal of the sampling capacitor 122-and the positive electrode terminal of the voltage source 123-1 in accordance with the third switch control signal (φ3). For example, the digital signal $DAC_{INP}$ which is an output signal from the analog/digital converter 21 corresponds to the third switch control signal (φ3), and the switch 124-1 shorts or opens the first terminal of the sampling capacitor 122-1 and the positive electrode terminal of the voltage source 123-1 in accordance with the first digital signal $DAC_{INP}$.

Specifically, in the reset phase and the conversion phase of the differential voltage/time conversion circuit 11a, the switch 124-1 shorts the first terminal of the sampling capacitor 122-1 and the positive electrode terminal of the voltage source 123-1. On the other hand, in the sample phase of the differential voltage/time conversion circuit 11a, the switch 124-1 opens the first terminal of the sampling capacitor 122-1 and the positive electrode terminal of the voltage source 123-1. Further, in the conversion phase, the sampling capacitor 122-1 stores a first voltage which is a difference between the input voltage $V_{INP}$ and a voltage corresponding to a result of converting the first digital signal $DAC_{INP}$ into an analog signal. In more detail, when a signal of, e.g., 1 bit is input to the switch 124-1 as the first digital signal $DAC_{INP}$, the switch 124-1 is closed if the signal of 1 bit is "H", or the switch 124-1 is opened if the signal of 1 bit is "L". When the switch 124-1 is closed, a current flows from the voltage source 123-1 to the sampling capacitor 122-1, and the sampling capacitor 122-1 is charged with the first voltage. The first voltage stored in the sampling capacitor 122-1 is converted into the time signal $D_P$ by the voltage/time converting function. It is to be noted that, for example, when the first digital signal $DAC_{INP}$ is a digital signal of 2 bits, "$2^2-1$ (=3)" second sampling circuits 120-N, namely, the sampling circuits 120-1, 120-2, and 120-3 are prepared. A lower bit of the digital signal $DAC_{INP}$ is input to the switch 124-1, and a higher bit of the digital signal $DAC_{INP}$ is input to the switches 124-2 and 124-3. Further, like the example where the single second sampling circuit 120-1 is provided, the switches 124-1 to 124-3 are shorted or opened in accordance with the digital signal $DAC_{INP}$, and the sampling capacitors 122-1 to 122-N are charged with the first voltage.

In the case of supplying different voltages to the second sampling circuits 120-1 to 120-N, the adjustment voltage $V_{DAC}$ shown in FIG. 12 can be realized by using the voltages $V_{DAC1}$ to $V_{DACN}$ generated by the ladder resistor as shown in FIG. 3. An output terminal for each voltage $V_{DAC}$ is connected with a switch corresponding to the switch 124-1 in FIG. 12 to short or open the output terminal for each voltage $V_{DAC}$ and the sampling capacitors 122-1 to 122-N. In this case, the adjustment voltages $V_{DAC1}$ to $V_{DACN}$ can be generated by using one of reference voltages $V_{Ref}$.

The switch 131 of the bottom sampler 130 is arranged between the second terminals of the sampling capacitors 112 and 122-1 as well as the first input terminal of the comparator 141 and the bottom plate terminal $T_{BTM}$. The switch 131 shorts or opens the second terminals of the sampling capacitors 112 and 122-1 as well as the first input terminal of the comparator 141 and the bottom plate terminal $T_{BTM}$ in accordance with the first switch control signal (φ1)

Specifically, in the sample phase of the differential voltage/time conversion circuit 11a, the switch 131 shorts the second terminals of the sampling capacitors 112 and 122-1 as well as the first input terminal of the comparator 141 and the bottom plate terminal $T_{BTM}$. On the other hand, in the reset phase and the conversion phase of the differential voltage/time conversion circuit 11a, the switch 131 opens the second terminals of the sampling capacitors 112 and 122-1 as well as the first input terminal of the comparator 141 and the bottom plate terminal $T_{BTM}$.

The first input terminal of the comparator 141 in the detector 140 is connected to the second terminals of the sampling capacitors 112 and 122-1 and the switch 131. The second input terminal of the comparator 141 is connected to the positive electrode terminal of the voltage source 142. The output terminal of the comparator 141 is connected to the control terminal of the current source 151 in the signal generator 150, and outputs the time signal $D_P$. The negative electrode terminal of the voltage source 142 is grounded. The voltage source 142 generates the comparative reference voltage $V_{RC}$.

In the conversion phase of the differential voltage/time conversion circuit 11a, the comparator 141 compares a voltage of the first input terminal with a voltage of the second input terminal. The comparator 141 stops its operation in the sample phase and the reset phase of the differential voltage/time conversion circuit 11a.

Specifically, in the conversion phase of the differential voltage/time conversion circuit 11a, if the voltage of the first input terminal is lower than the voltage of the second input terminal, the comparator 141 outputs the time signal $D_P$ on the "H (High)" level (a power supply voltage). On the other hand, if the voltage of the first input terminal is equal to or higher than the voltage of the second input terminal, the comparator 141 outputs the time signal $D_P$ on the "L (Low)" level (a ground voltage).

The first terminal of the current source 151 in the signal generator 150 is grounded. The second terminal of the current source 151 is connected to the first terminal of the sampling capacitor 112, the switch 111, and the switch 114.

The current source 151 receives the time signal $D_P$ from the comparator 141 through the control terminal. If the time signal $D_P$ is on the "H" level, the current source 151 generates the constant current signal, and supplies the constant current signal to the first terminal of the sampling capacitor 112. On the other hand, if the time signal $D_P$ is on the "L" level, the current source 151 stops its operation.

Other structures and operations of the differential voltage/time conversion circuit 11a are the same as those of the circuit shown in FIG. 2.

Furthermore, in the negative converter 11aN, the input voltage $V_{INN}$ is input to the switches 111 and 121-1, and the digital signal $DAC_{INN}$ output from the analog/digital converter 21 is input to the switch 124-1. Moreover, the sampling capacitor 122-1 stores a second voltage which is a difference between the input voltage $V_{INP}$ and a voltage corresponding to a result of converting the digital signal $DAC_{INP}$ into an analog signal. The second voltage stored in the sampling capacitor 122-1 is converted into the time signal $D_N$ by the voltage/time converting function, and the time signal $D_N$ is output from the comparator 141. Other structures and operations of the negative converter 11aN are the same as those of the positive converter 11aP, and hence a description thereof will be omitted.

5. Effect of This Embodiment

According to the amplification circuit of the first embodiment, the amplifying operation can be stabilized, and a highly accurate amplification calculation can be executed.

The effect will be described in detail hereinafter.

There is a case that the voltage/time conversion circuit and the time/voltage conversion circuit are used in the amplification circuit, and the differential signals are used in these conversion circuits to improve the signal quality. In the case of using the differential signals, the voltage/time conversion circuit and the time/voltage conversion circuit have the differential configuration. When the voltage/time conversion circuit and the time/voltage conversion circuit have the differential configuration, since they have a common mode gain, common mode voltages output from the voltage/time conversion circuit and the time/voltage conversion circuit fluctuate due to, e.g., a fluctuation in input common mode voltages. A large fluctuation in common mode voltages may exceed a voltage range where an internal current source can appropriately operate in some cases, which can be a cause for an error in the amplification calculation.

On the other hand, in the amplification circuit according to the first embodiment, the output common mode voltage $V_{OUTCOM}$ is detected, and the bottom plate voltage $V_{B\_TM}$ which is supplied to the bottom plate terminal of the voltage/time conversion circuit at the time of sampling is controlled in accordance with a detection result. Consequently, the output common mode voltage $V_{OUTCOM}$ can be converged on the target voltage $V_{COM\_t}$ and stabilized, and the highly accurate amplification calculation can be executed.

Second Embodiment

An amplification circuit according to a second embodiment will now be described. In the second embodiment, a common mode voltage $V_{OUTCOM}$ is detected from time signals $D_P$ and $D_N$ output from a differential voltage/time conversion circuit 11. Here, a configuration different from the first embodiment will be described.

1. Configuration of Amplification Circuit

FIG. 13 is a block diagram showing a configuration of the amplification circuit according the second embodiment.

As shown in the drawing, the amplification circuit 20 includes a differential voltage/time conversion circuit 11, a differential time/voltage conversion circuit 12, and a common mode feedback circuit 13a. Since configurations of the differential voltage/time conversion circuit 11 and the differential time/voltage conversion circuit 12 are the same as the first embodiment, a description thereof will be omitted.

1.1 Common Mode Feedback Circuit

As shown in. FIG. 13, the common mode feedback circuit. 13a includes a common mode detection circuit 310a and an error amplifier 320. The common mode detection circuit 310a receives the time signals $D_P$ and $D_N$ output from the differential voltage/time conversion circuit 11, performs time/voltage conversion, and provides a voltage signal. Moreover, the common mode detection circuit 310a detects the common mode voltage $V_{OUTCOM}$ from the voltage signal, and outputs it to the error amplifier 320.

Figure 14:
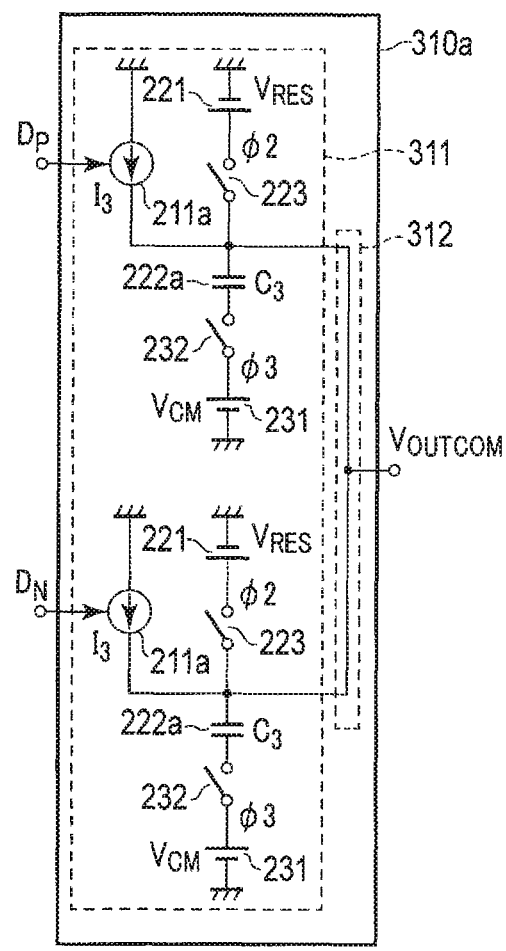
FIG. 14 is a circuit diagram showing a configuration of a common mode detection circuit in the second embodiment.

FIG. 14 is a circuit diagram showing a configuration of the common mode detection circuit 310a.

As shown in the drawing, the common mode detection circuit 310a includes a differential time/voltage conversion unit 311 and a common mode detection unit 312. In this differential time/voltage conversion unit 311, the time signals $D_P$ and $D_N$ are input to control terminals of current sources 211a, respectively. It is assumed that a current flowing through the current source 211a is I3, and the capacitance of each sampling capacitor 222a is $C_3$. Other structures are the same as those of the circuit shown in FIG. 5. Moreover, in the common mode detection unit 312, connecting first terminals of the two sampling capacitors 222a enables providing the common mode voltage $V_{OUTCOM}$.

In the circuit shown in FIG. 9, the common mode detection circuit 310 is directly connected to the output terminals $T_{OUTP}$ and $T_{OUTN}$ of the differential time/voltage conversion circuit 12, but the time signals $D_P$ and $D_N$ output from the differential voltage/time conversion circuit 11 are input to the differential time/voltage conversion unit 311 provided in the common mode detection circuit 310a in the circuit shown in FIG. 14, and hence load states of the output terminals of the differential voltage/time conversion circuit 11 do not fluctuate. Thus, the common mode voltage $V_{OUTCOM}$ can be more accurately detected than in the circuit shown in FIG. 9. It is to be noted that the current I3 and the capacitance $C_3$ of the common mode detection circuit 310a are selected so that a ratio of the current and the capacitance becomes fixed to a current I2 and capacitance $C_2$ of the differential time voltage conversion circuit 12 ($I2/C_2 = I3/C_3$). When the ratio of the current I3 and the capacitance $C_3$ of the common mode detection circuit 310a and the ratio of the current I2 and the capacitance $C_2$ of the differential time/voltage conversion circuit 12 are fixed, the common mode voltage $V_{OUTCOM}$ can be detected by using signals equivalent to the voltage signals $V_{OUTP}$ and $V_{OUTN}$ output from the differential time/voltage conversion circuit 12. Other structures and effects are the same as those of the first embodiment.

Third Embodiment

In a third embodiment, a description will be given as to a successive comparison type analog digital conversion circuit (an AD conversion circuit) having an amplification circuit which comprises a differential voltage/time conversion circuit 11 and a differential time/voltage conversion circuit 12 cascade-connected with each other in the preceding stage. Here, a configuration different from the first embodiment will be described.

1. Configuration of AD Conversion Circuit

FIG. 15 is a block diagram showing a configuration of an AD conversion circuit according to the third embodiment.

As shown in the drawing, the AD conversion circuit 30 includes a differential voltage/time conversion circuit 11, a differential time/voltage conversion circuit 12, a successive comparison type AD converter 14, a digital processing circuit 23, and a common mode feedback circuit 13b. Since configurations of the differential voltage/time conversion circuit 11 and the differential time/voltage conversion circuit 12 are the same as those in the first embodiment, a description thereof will be omitted.

1.1 Configuration of Successive Comparison Type AD Converter

FIG. 16 is a circuit diagram showing a configuration of the successive comparison type AD converter.

The successive comparison type AD converter 14 acquires a signal Ds by performing analog/digital conversion to voltage signals $V_{OUTP}$ and $V_{OUTN}$ output from the differential time/voltage conversion circuit 12, and outputs the signal Ds to the digital processing circuit 23. The digital processing circuit 23 outputs a digital signal $S_{OUT}$ based on the signal Ds, and further outputs a signal $S_{AR}$ that controls a switch control signal (φSAR). Additionally, the successive comparison type AD converter 14 detects a voltage $V_{COM}$ including a component of a common mode voltage from voltages VcompINP and VcompINN acquired from the voltage signals $V_{OUTP}$ and $V_{OUTN}$.

As shown in FIG. 16, the successive comparison type AD converter 14 includes a successive comparison type AD conversion unit 14a and a switched capacitor type common mode detection circuit 14b. The successive comparison type AD conversion unit 14a includes a positive successive conversion unit 14aP, a negative successive conversion unit 14aN, a comparator 417, and switches 416P and 416N.

The positive successive conversion unit 14aP includes sampling capacitors 401 to 405, switches 406 to 410, and switches 411 to 415. Capacitances of the sampling capacitors 401 to 405 are 8C, 4C, 2C, C, and C, respectively. C is a positive constant. The comparator 417 has a first input terminal and a second input terminal, compares the voltage VcompINP input to the first input terminal with the voltage VcompINN input to the second input terminal, and outputs the digital signal Ds corresponding to a comparison result.

Respective first terminals of the sampling capacitors 401 to 405 are connected to the switch 416P and the first input terminal of the comparator 417. Respective second terminals of the sampling capacitors 401 to 405 are connected to the switches 406 to 410, respectively. The respective second terminals of the sampling capacitors 401 to 405 are also connected to the switches 411 to 415, respectively. The voltage $V_{OUTP}$ is supplied to the switches 406 to 410. Further, a voltage VREFH or a voltage VREFL is supplied to the switches 411 to 415.

Moreover, the negative successive conversion unit 14aN includes sampling capacitors 401 to 405, switches 406 to 410, and switches 411 to 415 like the positive successive conversion unit 14aP. The voltage $V_{OUTN}$ is supplied to the switches 406 to 410. Respective first terminals of the sampling capacitors 401 to 405 are connected to the switch 41aN, and the second input terminal of the comparator 417. Other structures of the negative successive conversion unit 14aN are the same as those of the positive successive conversion unit 14aP, and hence a description thereof will be omitted.

The common mode detection circuit 14b includes a capacitor 418P, a capacitor 418N, and a switch 419. A first terminal of the capacitor 418P is connected to the first terminals of the sampling capacitors 401 to 405 in the positive successive conversion unit 14aP, respectively. A first terminal of the capacitor 418N is connected to the first terminals of the sampling apacitors 401 to 405 in the negative successive conversion unit 14aN, respectively. A second terminal of the capacitor 418P is connected to a second terminal of the capacitor 418N, and a node between these second terminals is connected to the switch 419. Moreover, the switch 419 is connected to the switches 416P and 416N. A voltage $V_{BIAS}$ is supplied to a node between the switch 419 and the switches 416P and 416N. The capacitors 418P and 418N are connected in series, and capacitance the capacitors 418P and 418N are the same $C_{CM}$. Thus, the voltage $V_{COM}$ including a component of the common mode voltage is detected from a node between the second terminal of the capacitor 418P and the second terminal of the capacitor 418N.

1.2 Operation of Successive Comparison Type AD Converter

In a sample phase, the switches 406 to 410 short or open the second terminals of the sampling capacitors 401 to 405 and a terminal to which the voltage $V_{OUTP}$ is supplied in accordance with a switch control signal (φS), respectively. Additionally, the switches 416P and 416N short or open the first terminals of the sampling capacitors 401 to 405 and the voltage $V_{BIAS}$ in accordance with the switch control signal (φS). The switch 419 shorts or opens the second terminals of the capacitors 418P and 418N and the voltage $V_{BIAS}$ in accordance with the switch control signal (φS).

Specifically, in the sample phase, the following operation is carried out. The switches 406 to 410 short the second terminals of the sampling capacitors 401 to 405 and the terminal to which the voltage $V_{OUTP}$ is supplied in accordance with the switch control signal (φS), respectively. The switches 416P and 416N short the first terminals of the sampling capacitors 401 to 405 and the voltage $V_{BIAS}$ in accordance with the switch control signal (φS), respectively. The switch 419 shorts the second terminals of the capacitors 418P and 418N and the voltage $V_{BIAS}$ in accordance with the switch control signal (φS), respectively.

In successive comparison (SAR), the switches 411 to 415 short or open the second terminals of the sampling capacitors 401 to 405 and a terminal to which a voltage VREFH is supplied or a terminal to which a voltage VREFL is supplied in accordance with the switch control signal (φSAR), respectively.

Specifically, at the time of the successive comparison, the following operation is carried out. During a first period of the successive comparison, the switch 411 shorts the second terminal of the sampling capacitor 401 and the terminal to which the voltage VREFH is supplied or the terminal to which the voltage VREFL is supplied in accordance with the switch control signal (φSAR). On the other hand, the switches 412 to 415 short the second terminals of the sampling capacitors 402 to 405 and the terminal to which the voltage VREFH is supplied or the terminal to which the voltage VREFL is supplied, respectively.

Additionally, during a second period of the successive comparison, the switch 412 shorts the second terminal of the sampling capacitor 402 and the terminal to which the voltage VREFH is supplied or the terminal to which the voltage VREFL is supplied in accordance with the switch control signal (φSAR), respectively. On the other hand, the switches 411 and 413 to 415 short the second terminals of the sampling capacitors 401 and 403 to 405 and the terminal to which the voltage VREFH is supplied or the terminal to which the voltage VREFL is supplied.

During a third period of the successive comparison, the switch 413 shorts the second terminal of the sampling capacitor 403 and the terminal to which the voltage VREFH is supplied or the terminal to which the voltage VREFL is supplied in accordance with the switch control signal (φSAR). On the other hand, the switches 411, 412, 414, and 415 short the second terminals of the sampling capacitors 401, 402, 404, and 405 and the terminal to which the voltage VREFH is supplied or the terminal to which the voltage VREFL is supplied.

During a fourth period of the successive comparison, the switch 414 shorts the second terminal of the sampling capacitor 404 and the terminal to which the voltage VREFH is supplied or the terminal to which the voltage VREFL is supplied in accordance with the switch control signal (φSAR). On the other hand, the switches 411, 412, 413, and 415 short the second terminals of the sampling capacitors 401, 402, 403, and 405 and the terminal to which the voltage VREFH is supplied or the terminal to which the voltage VREFL is supplied.

During a fifth period of the successive comparison, the switch 415 shorts the second terminal of the sampling capacitor 405 and the terminal to which the voltage VREFH is supplied or the terminal to which the voltage VREFL is supplied in accordance with the switch control signal (φSAR). On the other hand, the switches 411, 412, 413, and 414 short the second terminals of the sampling capacitors 401, 402, 403, and 404 and the terminal to which the voltage VREFH is supplied or the terminal to which the voltage VREFL is supplied, respectively.

Figure 17:
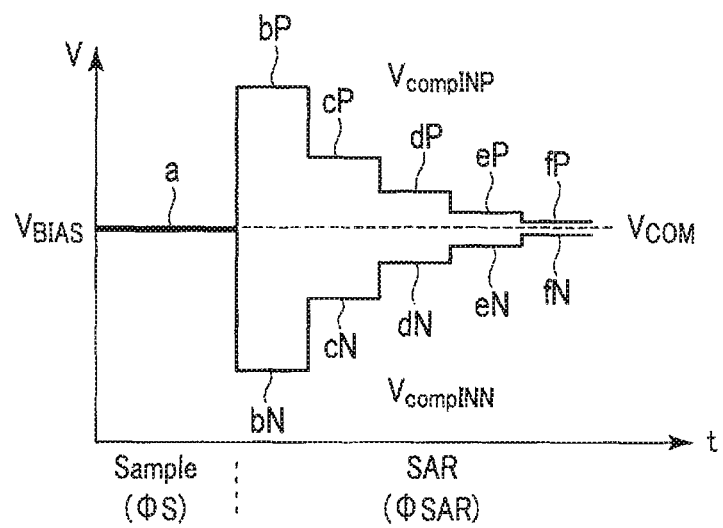
FIG. 17 is a view showing voltages input to a comparator of the successive comparison type AD converter in the third embodiment.

FIG. 17 is a view showing voltages input to the comparator 417 of the successive comparison type AD converter 14. Operations in the sample phase and the successive comparison will now be described with reference to FIG. 17.

In the sample phase, the voltages VcompINP and VcompINN are fixed to the voltage $V_{BIAS}$ in accordance with the switch control signal (φS) as indicated by a in FIG. 17. Further, the switches 406 to 410 in the positive successive conversion unit 14aP short the second terminals of the sampling capacitors 401 to 405 and the terminal to which the voltage $V_{OUTP}$ is supplied in accordance with the switch control signal (φS), respectively. The switches 406 to 410 in the negative successive conversion unit 14aN short the second terminals of the sampling capacitors 401 to 405 and the terminal to which the voltage $V_{OUTN}$ is supplied in accordance with the switch control signal (φS), respectively.

On the other hand, at the time of the successive comparison, the voltages VcompINP and VcompINN operate to approximate the voltage $V_{COM}$ shown in the following Expression (16).

$$V_{COM} = V_{BIAS} - \frac{V_{OUTP} + V_{OUTN}}{2} + \frac{V_{REFH} + V_{REFL}}{2} \quad (16)$$

During the first period of the successive comparison, for example, the voltage VcompINP takes a voltage indicated by bP in FIG. 17, and the voltage VcompINN takes a voltage indicated by bN. Specifically, in the positive successive conversion unit 14aP, the switch 411 shorts the second terminal of the sampling capacitor 401 and the terminal to which the voltage VREFH is supplied. The switches 412 to 415 short the second terminals of the sampling capacitors 402 to 405 and the terminal to which the voltage VREFL is supplied, respectively. Consequently, for example, the voltage VcompINP becomes the voltage indicated by bP in FIG. 17.

In the negative successive conversion unit 14aN, the switch 411 shorts the second terminal of the sampling capacitor 401 and the terminal to which the voltage VREFL is supplied. The switches 412 to 415 short the second terminals of the sampling capacitors 402 to 405 and the terminal to which the voltage VREFH is supplied, respectively. Consequently, for example, the voltage VcompINN becomes the voltage indicated by bN in FIG. 17.

The comparator 417 compares the voltage VcompINP (the voltage bP) with the voltage VcompINN (the voltage bN), and outputs a signal Ds corresponding to a comparison result to the digital processing circuit 23. The digital processing circuit 23 processes the signal Ds, outputs a signal that controls the switch control signal (φSAR), and also outputs a digital signal $S_{OUT}$.

OUT

During the second period of the successive comparison, for example, the voltage VcompINP takes a voltage indicated by cP in FIG. 17, and the voltage VcompINN takes a voltage indicated by cN. Specifically, in the positive successive conversion unit 14aP, the switch 412 shorts the second terminal of the sampling capacitor 402 and the terminal to which the voltage VREFH is supplied. The switches 411 and 413 to 415 short the second terminals of the sampling capacitors 401 and 403 to 405 and either the terminal to which the voltage VREFH is supplied or the terminal to which the voltage VREFL is supplied in accordance with the switch control signal (φSAR) controlled by the signal output from the digital processing circuit 23, respectively. Consequently, for example, the voltage VcompINP becomes the voltage indicated by cP in FIG. 17.

In the negative successive conversion unit 14aN, the switch 412 shorts the second terminal of the sampling capacitor 402 and the terminal to which a voltage VREFLH is supplied. The switches 411 and 413 to 415 short the second terminals of the sampling capacitors 401 and 403 to 405 and either the terminal to which the voltage VREFH is supplied or the terminal to which the voltage VREFL is supplied in accordance with the switch control signal (φSAR) controlled by the signal $S_{AR}$, respectively. Consequently, for example, the voltage VcompINN becomes the voltage indicated by cN in FIG. 17.

The comparator 417 compares the voltage VcompINP (the voltage cP) with the voltage VcompINN (the voltage cN), and outputs the signal Ds corresponding to a comparison result to the digital processing circuit 23. The digital processing circuit 23 processes the signal Ds, outputs a signal $S_{AR}$ that controls the, switch control signal (φSAR), and also outputs the digital signal $S_{OUT}$.

Thereafter, during the third, fourth, and fifth periods of the successive comparison, the operation conforming to the second period is carried out, the voltage VcompINP takes, e.g., voltages indicated by dP, eP, and fP respectively, and the voltage VcompINN takes voltages indicated by dN, eN, and fN respectively.

The voltage $V_{COM}$ may be detected during any period the successive comparison. Furthermore, as the number of cycles (the number of periods) of the successive comparison increases, a difference between the voltage VcompINP input to the first input terminal of the comparator 417 and the voltage VcompINN input to the second input terminal of the same approximates 0. Thus, the common mode detection circuit 14b itself can be omitted. In this case, as the common mode voltage, either the voltage VcompINP or VcompINN can be detected, or shorting can be performed after completion of the successive comparison to carry out the detection.

According to the common mode voltage detection method, as understood from Expression (16), in the magnitude relation between the common mode voltage (($V_{OUTP}$+$V_{OUTN}$)/2) of the voltages $V_{OUTP}$ and $V_{OUTN}$ input to the successive comparison AD converter 14 and the common mode voltage ((VREFH+VREFL)/2) of the reference voltages VREFH and VREFL, the voltage $V_{COM}$ is smaller than the voltage if the common mode voltage of the voltages $V_{OUTP}$ and $V_{OUTN}$ is larger, and the voltage $V_{COM}$ is larger than the voltage $V_{BIAS}$ if the common mode voltage of the reference voltages VREFH and VREFL is larger.

Thus, the target voltage $V_{COM\_t}$ of the voltage $V_{COM}$ supplied to the second input terminal of the error amplifier 320 is set to the voltage $V_{BIAS}$. Consequently, the error amplifier 320 adjusts the bottom plate voltage $V_{BTM}$ to become higher if the voltage $V_{COM}$ is higher than the target voltage $V_{com\_t}$. On the other hand, the error amplifier 320 adjusts the bottom plate voltage $V_{BTM}$ to become lower if the voltage $V_{COM}$ is lower than the target voltage $V_{com\_t}$. Consequently, as represented by Expression (15), even if the common mode voltage of the input voltages $V_{INP}$ and $V_{INN}$ fluctuates, the voltage $V_{COM}$ including the component of the common mode voltage can be converged on the target voltage $V_{com\_t}$ and stabilized.

2. Modification of At) Conversion Circuit

An example of application to a pipeline type AD conversion circuit will now be described as a modification.

2.1 Configuration of AD Conversion Circuit

Figure 18:
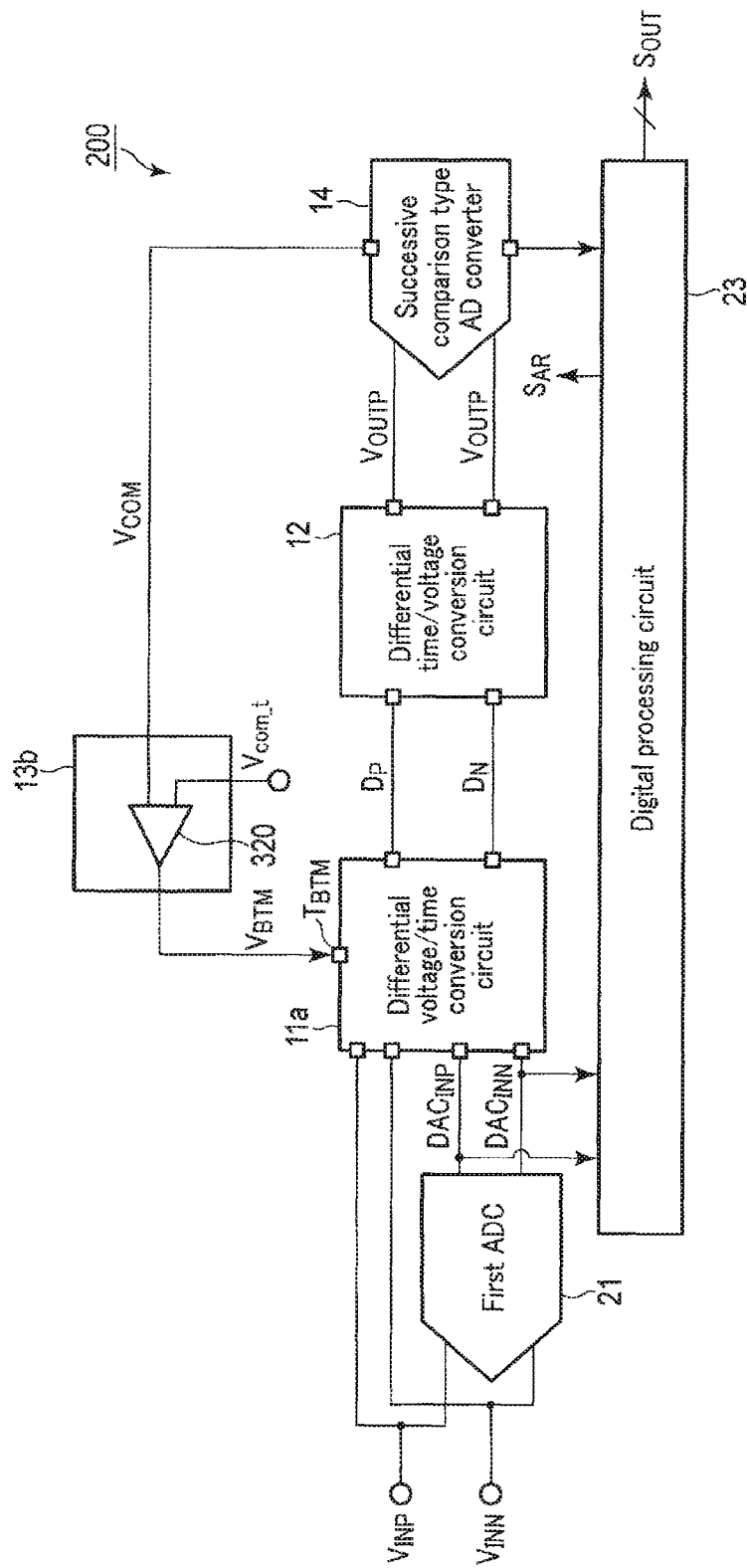
FIG. 18 is a block diagram showing a configuration of a pipeline type AD conversion circuit according to a modification of the third embodiment.

FIG. 18 is a block diagram showing a configuration of a pipeline type AD conversion circuit. As shown in the drawing, an AD conversion circuit 200 includes a first analog/digital converter (ADC) 21, a differential voltage/time conversion circuit 11a, a differential time/voltage conversion circuit 12, a common mode feedback circuit 13b, a successive comparison type AD converter 14 as a second analog/digital converter, and a digital processing circuit 23.

An outline of an operation of the AD conversion circuit will now be described hereinafter.

The first analog/digital converter 21 generates a digital signal $DAC_{INP}$ by performing analog/digital conversion to an input voltage $V_{INP}$, and generates a digital signal $DAC_{INN}$ by performing analog/digital conversion to an input voltage $V_{INN}$. The first analog/digital converter 21 outputs the digital signal $DAC_{INP}$ and the digital signal $DAC_{INN}$ to the differential voltage/time conversion circuit 11a and the digital processing circuit 23.

The differential voltage/time conversion circuit 11a includes a voltage/time converting function as well as a digital/analog converting function. That is, the differential voltage/time conversion circuit 11a acquires a first voltage (a residual signal) which is a difference between the input voltage $V_{INP}$ and a voltage corresponding to a result of converting the digital signal $DAC_{INP}$ into an analog signal, and performs voltage/time conversion to the first voltage to generate a time signal $D_P$. Further, the differential voltage/time conversion circuit 11a acquires a second voltage (a residual signal) which is a difference between the input voltage $V_{INN}$ and a voltage corresponding to a result of converting the digital signal $DAC_{INN}$ into an analog signal, and performs voltage/time conversion to the second voltage to generate a time signal $D_N$.

The difference time/voltage conversion circuit restores the first and second voltages by performing time/voltage conversion to the time signals $D_P$ and $D_N$, thereby generating voltage signals $V_{OUTP}$ and $V_{OUTN}$, respectively. The differential time/voltage conversion circuit 12 outputs the voltage signals $V_{OUTP}$ and $V_{OUTN}$ to the successive comparison type AD converter 14.

The successive comparison type converter 14 obtains a signal $D_S$ by performing analog/digital conversion to the voltage signals $V_{OUTP}$ and $V_{OUTN}$. The successive comparison type AD converter 14 outputs the signal $D_S$ to the digital processing circuit 23. The digital processing circuit 23 outputs a signal $S_{AR}$ that controls a switch control signal ($\phi$SAR) based on the signal $D_S$. Furthermore, the digital processing circuit 23 outputs a digital signal $S_{SOUT}$ based on the digital signals $DAC_{INP}$ and $DAC_{INN}$ and the signal $D_S$.

Other structures and operations of the AD conversion circuit 200 are the same as those of the circuit shown in FIGS. 12, 15, and others, and hence a description thereof will be omitted.

3. Effect of This Embodiment

In the third embodiment and the modification, since the voltage $V_{COM}$ including the component of the common mode voltage can be stabilized at a target voltage, a highly accurate amplification calculation can be executed, and highly accurate analog/digital conversion can be carried out. Other effects are the same as the first embodiment.

As described above, according to the foregoing embodiments, the highly accurate amplification circuit and the analog/digital conversion circuit can be provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An amplification circuit comprising:
   a differential amplifier including a sampling circuit that samples a first voltage which is a difference between an adjustment voltage supplied to a first terminal and a first input voltage, and a second voltage which is a difference between the adjustment voltage and a second input voltage, the differential amplifier amplifying the first voltage to output a first voltage signal and amplifying the second voltage to output a second voltage signal; and
   a feedback circuit which detects a common mode voltage of the first voltage signal and a second voltage signal, and adjusts the adjustment voltage which is supplied to the first terminal in accordance with the common mode voltage.

2. The amplification circuit according to claim 1, wherein the sampling circuit comprises:
   a first capacitor which stores the first voltage in a sample phase to sample the first and second input voltages;
   a first voltage source;
   a first switch which opens the first capacitor and the first voltage source in the sample phase, and shorts the first capacitor and the first voltage source in a conversion phase after the sample phase;
   a second capacitor which stores the second voltage in the sample phase;
   a second voltage source; and
   a second switch which opens the second capacitor and the second voltage source in the sample phase, and shorts the second capacitor and the second voltage source in the conversion phase.

3. The amplification circuit according to claim 1, wherein the differential amplifier comprises:
   a differential voltage/time conversion circuit which converts the first input voltage into a first time signal, and converts the second input voltage into a second time signal in accordance with the adjustment voltage; and
   a differential time/voltage conversion circuit which converts the first time signal into the first voltage signal, and converts the second time signal into the second voltage signal.

4. The amplification circuit according to claim 3, wherein the differential voltage/time conversion circuit comprises:
   a first sampling circuit including a first capacitor, a first voltage source, a first switch which shorts or opens a terminal to which the first input voltage is input and the first capacitor, and a second switch which shorts or opens the first capacitor and the first voltage source; and
   a second sampling circuit including a second capacitor, a second voltage source, a third switch which shorts or opens terminal to which the second input voltage is input and the second capacitor, and a fourth switch which shorts or opens the second capacitor and the second voltage source, wherein, in the differential voltage/time conversion circuit, in a sample phase to sample the first and second input voltages, the first switch shorts the terminal to which the first input voltage is input and the first capacitor, the second switch opens the first capacitor and the first voltage source, the third switch shorts the terminal to which the second input voltage is input and the second capacitor, and the fourth switch opens the second capacitor and the second voltage source, and in a conversion phase after the sample phase, the first switch opens the terminal to which the first input voltage is input and the first capacitor, the second switch shorts the first capacitor and the first voltage source, the third switch opens the terminal to which the second input voltage is input and the second capacitor, and the fourth switch shorts the second capacitor and the second voltage source, wherein the differential time/voltage conversion circuit comprises:

a third sampling circuit including a third capacitor, a third voltage source, and a fifth switch which shorts or opens the third capacitor and the third voltage source, a fourth voltage source, and a sixth switch which shorts or opens the third capacitor and the fourth voltage source; and a fourth sampling circuit including a fourth capacitor, a fifth voltage source, and a seventh switch which shorts or opens the fourth capacitor and the fifth voltage source, a sixth voltage source, and an eighth switch which shorts or opens the fourth capacitor and the sixth voltage source, wherein, in the differential time/voltage conversion circuit, in the sample phase, the fifth switch opens the third capacitor and the third voltage source, the sixth switch shorts the third capacitor and the fourth voltage source, the seventh switch opens the fourth capacitor and the fifth voltage source, and the eighth switch shorts the fourth capacitor and the sixth voltage source, and in a hold phase the conversion phase, the fifth switch opens the third capacitor and the third voltage source, the sixth switch opens the third capacitor and the fourth voltage source, the seventh switch opens the fourth capacitor and the fifth voltage source, and the eighth switch opens the fourth capacitor and the sixth voltage source.

5. The amplification circuit according to claim 4, wherein the differential voltage/time conversion circuit further comprises the first voltage source, a resistance ladder connected to the first voltage source, and a ninth switch that switches connection of the resistance ladder.

6. An amplification circuit comprising:

a differential voltage/time conversion circuit which converts a first input voltage into a first time signal, and converts a second input voltage into a second time signal, in accordance with an adjustment voltage supplied to a first terminal;

a differential time/voltage conversion circuit which converts the first time signal into the first voltage signal, and converts the second time signal into the second voltage signal; and a feedback circuit which detects one of a common mode voltage of the first time signal and the second time signal, and a common mode voltage of the first voltage signal and the second, voltage signal, and adjusts the adjustment voltage which is supplied to the first terminal in accordance with the one of common mode voltages.

7. The amplification circuit according to claim 6, further comprising a first analog/digital converter which converts the first input voltage into a first digital signal, and converts the second input voltage into a second digital signal, wherein the differential voltage/time conversion circuit comprises a first capacitor, a second capacitor, a first current source which supplies a current to the first capacitor, a second current source which supplies a current to the second capacitor, a first comparator, and a second comparator, the differential voltage/time conversion circuit stores, in the first capacitor, a first voltage which is a difference between the first input voltage and a voltage corresponding to a result of converting the first digital signal into an analog signal in a sample phase, to sample the first and second input voltages, and converts the first voltage into a first time signal based on a result of comparing the first voltage that changes due to the current supplied from the first current source with a reference voltage by the first comparator in a conversion phase after the sample phase, and the differential voltage/time conversion circuit stores, in the second capacitor, a second voltage which is a difference between the second input voltage and a voltage corresponding to a result of converting the second digital signal into an analog signal in the sample phase, and converts the second voltage into a second time signal based on a result of comparing the second voltage that changes due to the current supplied from the second current source with the reference voltage by the second comparator in the conversion phase.

8. The amplification circuit according to claim 7, wherein the differential voltage/time conversion circuit comprises:

a first sampling circuit including a first capacitor, a first voltage source, a first switch which shorts or opens a terminal to which the first input voltage is input and the first capacitor, and a second switch which shorts or opens the first capacitor and the first voltage source; and a second sampling circuit including a second capacitor, a second voltage source, a third switch which shorts or opens a terminal to which the second input voltage is input and the second capacitor, and a fourth switch which shorts or opens the second capacitor and the second voltage source, wherein, in the differential voltage/time conversion circuit, in a sample phase to sample the first and second input voltages, the first switch shorts the terminal to which the first input voltage is input and the first capacitor, the second switch opens the first capacitor and the first voltage source, the third switch shorts the terminal to which the second input voltage is input and the second capacitor, and the fourth switch opens the second capacitor and the second voltage source, and in a conversion phase after the sample phase, the first switch opens the terminal to which the first input voltage is input and the first capacitor, the second switch shorts the first capacitor and the first voltage source, the third switch opens the terminal to which the second input voltage is input and the second capacitor, and the fourth switch shorts the second capacitor and the second voltage source, wherein the differential time/voltage conversion circuit comprises:

a third sampling circuit including a third capacitor, a third voltage source, and a fifth switch which shorts or opens the third capacitor and the third voltage source, a fourth voltage source, and a sixth switch which shorts or opens the third capacitor and the fourth voltage source; and a fourth sampling circuit including a fourth capacitor, a fifth voltage source, and a seventh switch which shorts or opens the fourth capacitor and the fifth voltage source, a sixth voltage source, and an eighth switch which shorts or opens the fourth capacitor and the sixth voltage source, wherein, in the differential time/voltage conversion circuit, in the sample phase, the fifth switch opens the third capacitor and the third voltage source, the sixth switch shorts the third capacitor and the fourth voltage source, the seventh switch opens the fourth capacitor and the fifth voltage source, and the eighth switch shorts the fourth capacitor and the sixth voltage source, and in a hold phase after the conversion phase, the fifth switch opens the third capacitor and the third voltage source, the sixth switch opens the third capacitor and the fourth voltage source, the seventh switch opens the fourth capacitor and the fifth voltage source, and the eighth switch opens the fourth capacitor and the sixth voltage source.

9. The amplification circuit according to claim 8,
wherein the differential voltage/time conversion circuit further comprises a resistance ladder connected to the first voltage source and a ninth switch that switches connection of the resistance ladder.

10. An analog/digital conversion circuit comprising:
a differential voltage/time conversion circuit which converts a first input voltage into a first time signal, and converts a second input voltage into a second time signal, in accordance with an adjustment voltage supplied to a first terminal;

a differential time/voltage conversion circuit which converts the first time signal into the first voltage signal, and converts the second time signal into the second voltage signal;

a first analog/digital converter including a sampling circuit that samples the first voltage signal and the second voltage signal and a detection circuit which detects a common mode voltage by use of the first voltage signal and the second voltage signal sampled by the sampling circuit, the first analog/digital converter converting the first voltage signal and the second voltage signal into digital signals; and a feedback circuit which adjusts the adjustment voltage which is supplied to the first terminal in accordance with the common mode voltage.

11. The analog/digital conversion circuit according to claim 10,
further comprising a second analog/digital converter which converts the first input voltage into a first digital signal, and converts the second input voltage into a second digital signal, wherein the differential voltage/time conversion circuit comprises a first capacitor, a second capacitor, a first current source which supplies a current to the first capacitor, a second current source which supplies a current to the second capacitor, a first comparator, and a second comparator, the differential voltage/time conversion circuit stores, in the first capacitor, a first voltage which is a difference between the first input voltage and a voltage corresponding to a result of converting the first digital signal into an analog signal in a sample phase to sample the first and second input voltages, and converts the first voltage into a first time signal based on a result of comparing the first voltage that changes due to the current supplied from the first current source with a reference voltage by the first comparator in a conversion phase after the sample phase, and the differential voltage/time conversion circuit stores, in the second capacitor, a second voltage which is a difference between the second input voltage and a voltage corresponding to a result of converting the second digital signal into an analog signal in the sample phase, and converts the second voltage into a second time signal based on a result of comparing the second voltage that changes due to the current supplied from the second current source with the reference voltage by the second comparator in the conversion phase.

12. The analog/digital conversion circuit according to claim 11,
wherein the differential voltage/time conversion circuit comprises:

a first sampling circuit including a first capacitor, a first voltage source, a first switch which shorts or opens a terminal to which the first input voltage is input and the first capacitor, and a second switch which shorts or opens the first capacitor and the first voltage source; and a second sampling circuit including a second capacitor, a second voltage source, a third switch which shorts or opens a terminal to which the second input voltage is input and the second capacitor, and a fourth switch which shorts or opens the second capacitor and the second voltage source, wherein, in the differential voltage/time conversion circuit, in a sample phase to sample the first and second input voltages, the first switch shorts the terminal to which the first input voltage is input and the first capacitor, the second switch opens the first capacitor and the first voltage source, the third switch shorts the terminal to which the second input voltage is input and the second capacitor, and the fourth switch opens the second capacitor and the second voltage source, and in a conversion phase after the sample phase, the first switch opens the terminal to which the first input voltage is input and the first capacitor, the second switch shorts the first capacitor and the first voltage source, the third switch opens the terminal to which the second input voltage is input and the second capacitor, and the fourth switch shorts the second capacitor and the second voltage source, wherein the differential time/voltage conversion circuit comprises:

a third sampling circuit including a third capacitor, a third voltage source, and a fifth switch which shorts or opens the third capacitor and the third voltage source, a fourth voltage source, and a sixth switch which shorts or opens the third capacitor and the fourth voltage source; and a fourth sampling circuit including a fourth capacitor, a fifth voltage source, and a seventh switch which shorts or opens the fourth capacitor and the fifth voltage source, a sixth voltage source, and an eighth switch which shorts or opens the fourth capacitor and the sixth voltage source, wherein, in the differential time/voltage conversion circuit, in the sample phase, the fifth switch opens the third capacitor and the third voltage source, the sixth switch shorts the third capacitor and the fourth voltage source, the seventh switch opens the fourth capacitor and the fifth voltage source, and the eighth switch shorts the fourth capacitor and the sixth voltage source, and in a hold phase after the conversion phase, the fifth switch opens the third capacitor and the third voltage source, the sixth switch opens the third capacitor and the fourth voltage source, the seventh switch opens the fourth capacitor and the fifth voltage source, and the eighth switch opens the fourth capacitor and the sixth voltage source.

13. The analog/digital conversion circuit according to claim 12, wherein the differential voltage/time conversion circuit further comprises a resistance ladder connected to the first voltage source and a ninth switch that switches connection of the resistance ladder.

\* \* \* \* \*